(12) United States Patent
Aiso et al.

(10) Patent No.: US 6,376,328 B1
(45) Date of Patent: Apr. 23, 2002

(54) METHOD FOR PRODUCING CAPACITOR ELEMENTS, AND CAPACITOR ELEMENT

(75) Inventors: Fumiki Aiso; Toshiyuki Hirota, both of Tokyo (JP)

(73) Assignee: NEC Corporation, Tokyo (JP)

( * ) Notice: Subject to any disclaimer, the term of this patent is extended or adjusted under 35 U.S.C. 154(b) by 38 days.

(21) Appl. No.: 09/584,947

(22) Filed: Jun. 1, 2000

(30) Foreign Application Priority Data

Jun. 1, 1999 (JP) ............................................ 11-153267

(51) Int. Cl.$^7$ ................................................ H01L 21/20
(52) U.S. Cl. ........................ 438/398; 438/255; 257/296; 257/309
(58) Field of Search ........................... 438/255, 398; 257/296, 309

(56) References Cited

U.S. PATENT DOCUMENTS

| | | | | |
|---|---|---|---|---|
| 5,897,352 A | * | 4/1999 | Lin et al. | 438/238 |
| 5,913,119 A | * | 6/1999 | Lin et al. | 438/255 |
| 5,930,625 A | * | 7/1999 | Lin et al. | 438/253 |
| 6,046,083 A | * | 4/2000 | Lin et al. | 438/255 |
| 6,171,955 B1 | * | 1/2001 | Chen | 438/665 |
| 6,187,623 B1 | * | 2/2001 | Hirota et al. | 438/253 |
| 6,218,230 B1 | * | 4/2001 | Fujiwara et al. | 438/238 |
| 6,228,749 B1 | * | 5/2001 | Yamamoto | 438/482 |
| 2001/0030336 A1 | * | 10/2001 | Yamamoto | 257/296 |

FOREIGN PATENT DOCUMENTS

| | | |
|---|---|---|
| JP | 9-298278 | 11/1997 |
| JP | 10-70249 | 3/1998 |
| JP | 10-303368 | 11/1998 |
| JP | 11-145392 | 5/1999 |
| JP | 2000-91542 | 3/2000 |

* cited by examiner

Primary Examiner—Charles Bowers
Assistant Examiner—David S Blum
(74) Attorney, Agent, or Firm—Rosenman & Colin LLP

(57) ABSTRACT

A silicon layer containing microcrystal is formed on a semiconductor substrate 10 having an amorphous silicon layer 61a formed on the surface thereof (t1 and t2). Continuously, HSGs (hemispherical grains) are formed, in the same furnace, on the silicon layer 61a using microcrystal on the silicon layer 61a as a nucleus (t2 and t3). Further, a source gas containing impurities is introduced into the furnace to diffuse impurities into the HSGs (t3 and t4), wherein a lower electrode is formed. Also, during the processes from t1 through t4, the partial pressure of water and oxygen in the furnace is set to $1\times10^{-6}$ Torr or less. Furthermore, during the processes from t1 through t4, the temperature in the furnace is set to 550 through 600° C.

42 Claims, 14 Drawing Sheets

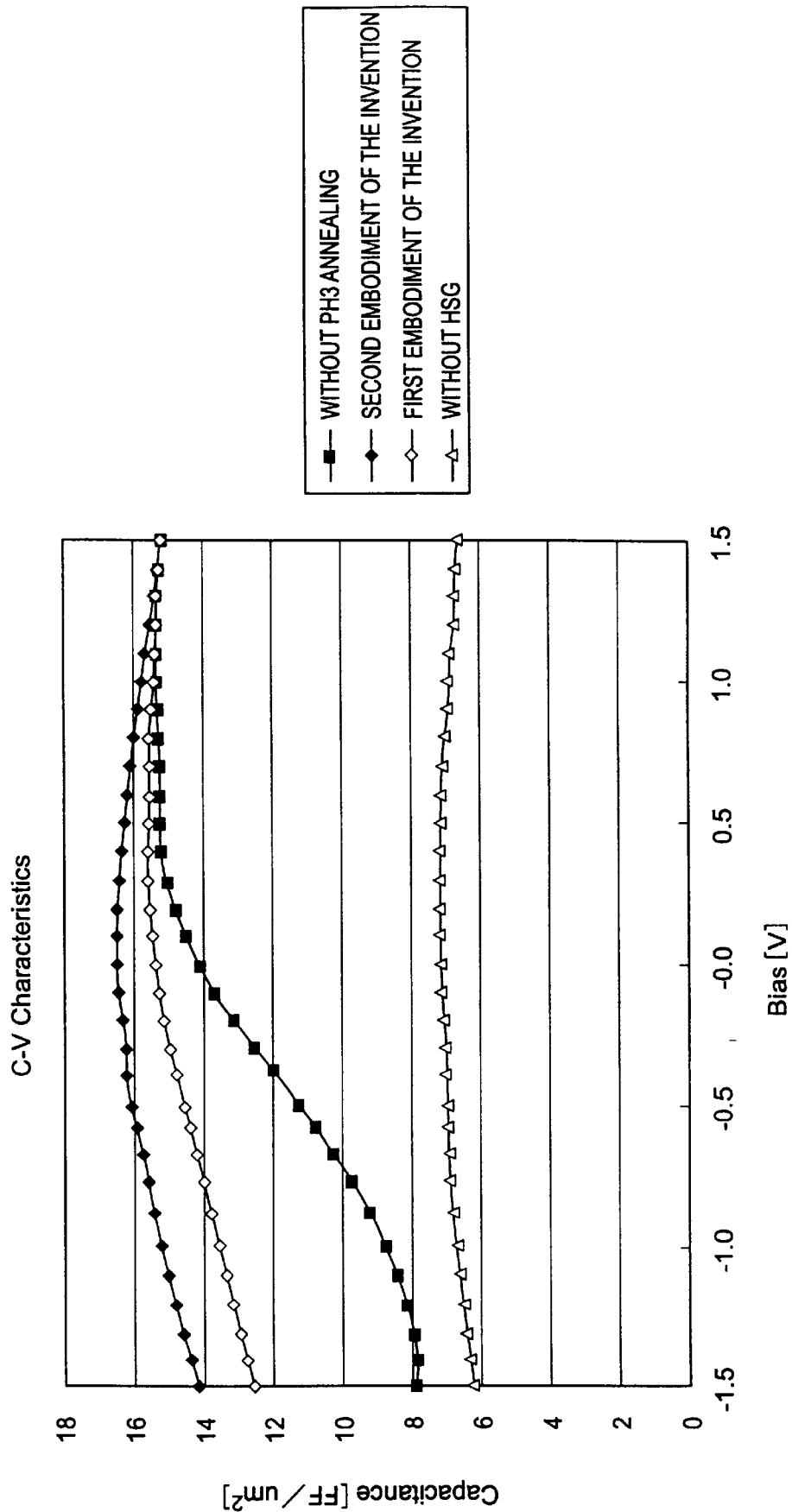

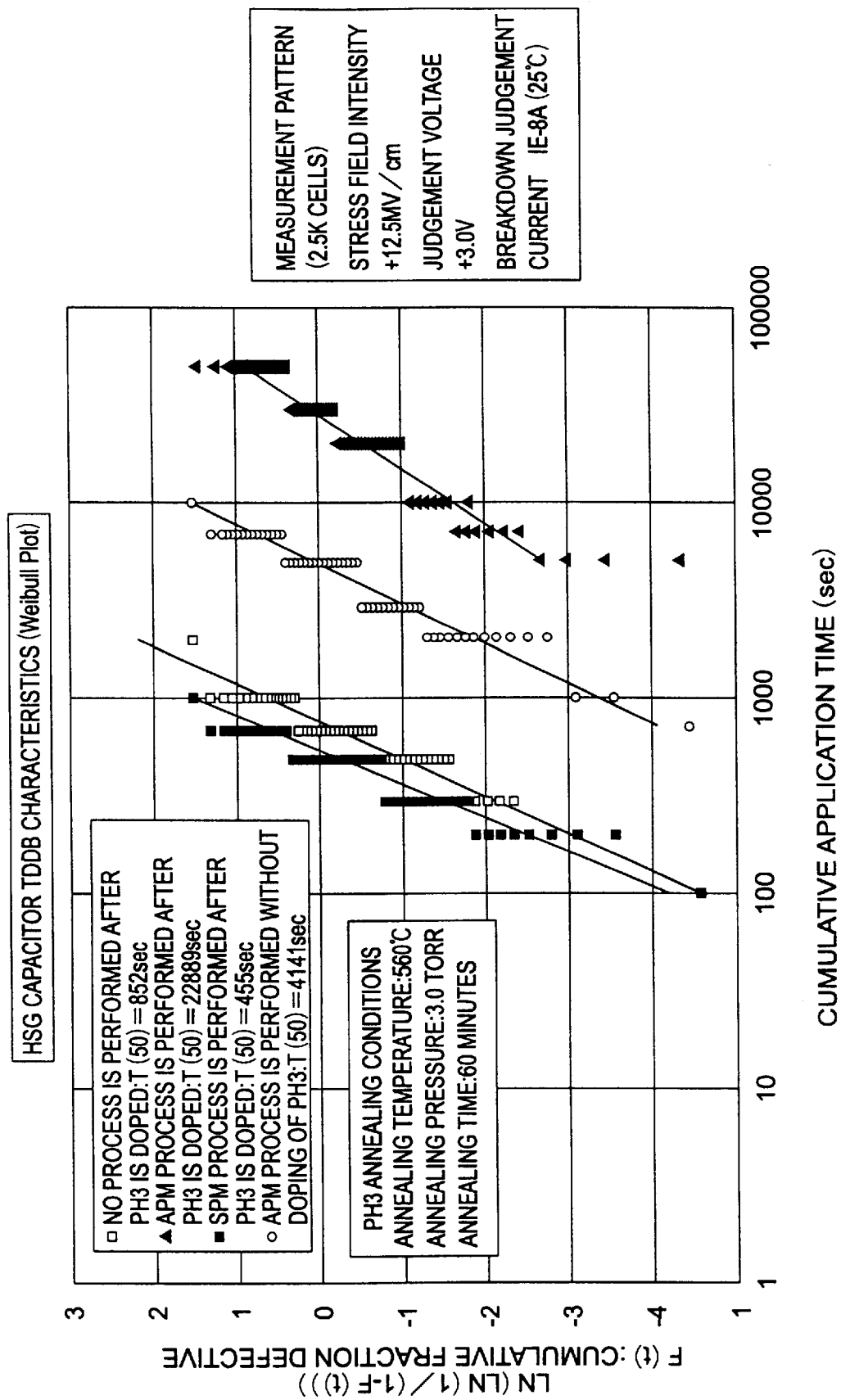

METHOD FOR PRODUCING CAPACITOR ELEMENTS, AND CAPACITOR ELEMENT

BACKGROUND OF THE INVENTION

1. Technical Field of the Invention

The present invention relates to a method for producing capacitor elements, and a capacitor element. In particular, the invention is directed at a method for producing capacitor elements, which enables improved operating reliability of capacitor elements.

2. Description of the Related Arts

Recently, in order to increase the capacitance of a capacitor element that constitutes a semiconductor device, for example, a DRAM (Dynamic Random Access Memory), a technology (HSG technology), which forms an HSG (Hemispherical Grain) in a lower electrode of a capacitor element, has been frequently employed.

In the HSG technology, thermal processing is applied to an amorphous silicon layer in a vacuum state to migrate silicon atoms, and an HSG is formed on the film surface, whereby the surface area of the lower electrode is increased, resulting in an increase in the capacitance of a capacitor element.

In the HSG technology, there are mainly two types of method, one of which is a blanket HSG method, and the other of which is a selection HSG method.

In the blanket HSG method, an amorphous silicon layer is formed in an LP-CVD (Low Pressure Chemical Vapor Deposition) furnace, thereby forming an HSG. In detail, the pressure in the LP-CVD furnace is set to, for example, 0.2 Torr or so, and the temperature is set to, for example, a transition temperature or so between amorphous and crystal, wherein a silane gas or a disilane gas is introduced into the furnace to form a silicon layer. After the silicon layer is formed, the supply of silane gas is stopped, wherein annealing is carried out for several minutes with a vacuum inside the furnace. And, silicon atoms are migrated to form an HSG on the film surface.

On the other hand, in the selection HSG method, an amorphous silicon layer is formed in advance and patterning is applied thereto. Natural oxide films and organic substances existing on the surface of the film are removed to clean the surface. Thereafter, an HSG is formed on the surface of an amorphous silicon layer, using an LP-CVD furnace, etc. In detail, the pressure inside the LP-CVD furnace is set to, for example, 1mTorr or so, and a silane gas is irradiated on the clean surface of the amorphous silicon layer, whereby micro crystals which become the growth nuclei of HSG are formed on the surface of the amorphous silicon layer. After that, the supply of silane gas is stopped, and the amorphous silicon layer containing micro crystals is annealed in a state where the pressure inside the furnace is kept on $1 \times 10^{-7}$ Torr or less, whereby silicon atoms are migrated to form an HSG on the film surface.

Also, even though either technology of the abovementioned blanket HSG method or the selection HSG method is employed, the HSG just after being formed includes almost no impurities. That is, almost no carrier is included in the just formed HSGs. Where almost no carrier exists in an electrode of a capacitor element, the capacitance is lowered due to depletion of the electrode.

One of the methods for diffusing impurities in the HSG is a method of injecting impurities from outside an HSG. For example, after an HSG is formed on the surface of a silicon layer, thermal processing is carried out at 700° C. in the atmosphere of POC13 (phosphorus oxytrichloride), using an LP-CVD furnace, etc. As described above, by thermally processing in the atmosphere of POC13, impurities can be sufficiently diffused in the HSG. But, the POC13 forms a smooth phosphorus glass film on the HSG surface by reaction with silicon contained in the HSG. The phosphorus glass film fills up clearance between the HSGs, resulting in a lowering of the surface area of the lower electrode. Therefore, the phosphorus glass film on the HSG surface must be removed by using fluoric acid, etc. However, since the phosphorus glass film is formed by a chemical reaction with silicon, there arises a problem by which the size of the HSG is made very small or some HSGs are omitted by removing the phosphorus glass film.

In addition the above description, technologies for diffusing impurities in HSGs are disclosed by Japanese Laid-Open Patent Publication Nos. 70249 of 1998 and 303368 of 1998.

In the technology disclosed in Japanese Laid-Open Patent Publication No. 70249 of 1998, impurities are injected into the HSGs by using an ion injection method after HSGs are formed on a silicon layer surface.

In the technology disclosed in Japanese Laid-Open Patent Publication No. 303368 of 1998, after HSGs are formed on a silicon layer surface, natural oxide films and contaminated substances on the surface of the HSGs are removed by using a wet type detergent such as a hydrogen fluoride acid solution and BOE (Buffer oxide etching solution), etc. Thereafter, impurities are diffused in the HSGs, using an LP-CVD apparatus and RTP (Rapid Thermal Processing) apparatus. In detail, in the case where an LP-CVD apparatus is used, thermal processing is carried out at 650 through 850° C. in an atmosphere of phosphine (PH3) to cause phosphorus to diffuse in the HSGS. On the other hand, in the case where the RTP apparatus is used, thermal processing is carried out at 550 through 900° C. in an atmosphere of phosphine to cause phosphorus to diffuse in the HSGS. In detail, in the LP-CVD apparatus, thermal processing is carried out at 700° C. for three hours and, in the RTP apparatus, thermal processing is carried out at 800° C. for 300 seconds.

In Japanese Laid-Open Patent Publication No. 303368 of 1998, such a technology has been disclosed, in which phosphine exited by plasma discharge is irradiated on HSGs for annealing in order to diffuse impurities in the HSGs.

However, the technologies disclosed in Japanese Laid-Open Patent Publication Nos. 70249 of 1998 and 303368 of 1998 described above still have the-following problems.

In the technology disclosed in Japanese Laid-Open Patent Publication No. 70249 of 1998, it is difficult to uniformly irradiate ions on the upper and lower parts of a cylinder type lower electrode, in particular, on a lower electrode having a high aspect ratio. Besides, if the energy for injection of ions is increased to dope sufficient impurities on the lower part of the lower electrode, there may arise such a problem by which the HSGs may collapse or be missed.

In Japanese Laid-Open Patent Publication No. 303368 of 1998, it has been found that a hold defect (an error caused when an electric charge cannot be maintained sufficiently long) frequently occur when making practical operations. Based on the results of analysis made by the present inventors, etc., the hold defect arises when water marks and natural oxide films exist in a minute area of the lower electrode having HSGs, and impurities are not sufficiently diffused in the lower electrode (HSG). Such water marks and natural oxide films remain when cleaning the HSG surface with a wet type detergent or may be formed in a drying process after cleaning. This is liable to occur after the HSGs are formed, and it is considered that it results from the shape thereof.

Also, recently, there are cases where a semiconductor device is constructed by the mixed of mounting DRAMs and logic circuits on the same chip. In a logic circuit production process, since a salicide (self-align silicide) process resides in a process-for producing logic circuits, the thermal allowance (amount of thermal load applied) is decreased in the process for producing DRAMs. In detail, in the case where a normal furnace is used, the thermal processing temperature must be 600° C. or less. And in the case where the RTP apparatus is used, processing at 800° C. or so for several minutes in total may be allowable.

In the technology disclosed by Japanese Laid-Open Patent Publication No. 303368 of 1998, where an LP-CVD apparatus is used, thermal processing is carried out at 700° C. for three hours. Therefore, the temperature exceeds the abovementioned thermal allowance in the process of formation of a lower electrode. On the other hand, where an RTP apparatus is used, thermal processing is carried out at 800° C. for 300 seconds, wherein the abovementioned thermal allowance is used in only the process of formation of a lower electrode. Also, in the case of thermal processing at 600° C. or less, sufficient impurities to suppress the depletion of the electrode cannot be diffused in the HSGs even though thermal processing is carried out for six hours. That is, it is found that this is not realistic.

In the technology disclosed by Japanese Laid-Open Patent Publication No. 303368 of 1998, in which plasma discharge is used, it is possible to diffuse a sufficient amount of phosphorus in the HSGs by thermal processing at 700° C. for 300 seconds. However, where a device (DRAM) was actually produced, it was observed that an increase in leak currents, etc., occurs at the gate insulation layer of a transistor connected to the lower electrode of a capacitor. In addition, in the plasma discharge, another problem occurs, by which phosphorus is likely to be deposited on the inner wall of a furnace, and generation of particles is increased.

Still further, as disclosed in Japanese Laid-Open Patent Publication No. 303368 of 1998, in order to prevent impurities from being re-diffused into the HSGs where thermal processing is carried out at a high temperature such as 700° C. or 800° C., a wafer is taken out of the furnace with the temperature reduced to 600° C. or so. Therefore, it takes much time to raise and lower the temperature, resulting in still another problem which is that of lowered production efficiency in the production of capacitor elements.

SUMMARY OF THE INVENTION

Therefore, it is an object of the invention to provide a method for producing capacitor elements, by which production efficiency can be improved. Also, it is another object of the invention to provide a capacitor element that is highly reliable in operation. Further, it is still another object of the invention to provide a method for producing capacitor elements at a low temperature, which is capable of reducing depletion of an electrode, that constitutes a capacitor element.

In order to achieve the abovementioned objects, a method for producing capacitor elements according to a first aspect of the invention is a method for producing capacitor elements constructed of a lower electrode, a dielectric body layer and an upper electrode, which are formed on a semiconductor substrate, comprising a first silicon layer forming step for forming a first amorphous silicon layer at an appointed area on the semiconductor substrate, a lower electrode surface rinsing step for rinsing the surface of the first silicon layer, a nucleus forming step for selectively forming a second amorphous silicon layer including microcrystal on the surface of the first silicon layer, an HSG forming step for growing HSGs (hemispherical Grains) using microcrystal included in the second silicon layer as a nucleus by annealing the first and second silicon layer at a low pressure or in the atmosphere of an inactive gas, and forming HSGs on the surface of the first silicon layer, an impurity diffusing step for forming a lower electrode by annealing while the HSGs are being exposed to a source gas including impurities and thermally diffusing the impurities in the HSGs, a dielectric body layer forming step for forming a dielectric body layer on the first silicon layer having the HSGs on the surface thereof, and an upper electrode forming step for forming an upper electrode on the dielectric body layer, wherein the partial pressure of oxygen and water is maintained at $1 \times 10^{-6}$ Torr or less at least between the HSG forming step and the impurity diffusing step.

With the invention, it is possible to prevent water marks and natural oxide films, etc., from being formed on the surface of HSGS. Therefore, a sufficient amount of impurities can be diffused in the HSGs even at a lower temperature like, for example, 550° C.

The nucleus forming step, the HSG forming step, and the impurity diffusing step may be carried out in the same reaction chamber of an LPCVD apparatus (low pressure chemical vapor deposition apparatus).

If so, it is possible to easily maintain the partial pressure of oxygen and water in the reaction chamber at $1 \times 10^{-6}$ Torr or less from the nucleus forming step to the impurity diffusing step.

In the nucleus forming step and the HSG forming step, the partial pressure of a remaining PH3 gas in the reaction chamber may be set to $1 \times 10^{-4}$ Torr or less.

If so, it is possible to prevent HSG growth from being suppressed.

After the impurity diffusing step, a step for reducing a remaining PH3 gas in the reaction chamber may be further provided, wherein after the semiconductor substrate is taken out from the reaction chamber, a gas containing silane or disilane is introduced into the reaction chamber.

Thereby, it is possible to prevent the HSG growth from being suppressed in the next HSG forming step.

A step, in which the minimum temperature on the inner wall of the reaction chamber is kept at 60° C. or more, a PH3 gas adsorbed at a low temperature portion in the reaction chamber is removed, and the remaining PH3 in the corresponding reaction chamber is reduced, may be further provided.

Thereby, it is possible to prevent HSG growth from being suppressed in the next HSG forming step.

Still another step may be provided, where a series of actions are repeated an appointed number of times., in which after the impurity diffusing step, an inactive gas is introduced into the reaction chamber after the semiconductor substrate is taken out from the reaction chamber, the pressure of the reaction chamber is increased and is kept for an appointed period of time, and subsequently the pressure is reduced, the low temperature portion in the reaction chamber is heated to allow the progression of the removal of PH3 gas adsorbed on the low temperature portion in the reaction chamber, and the remaining PH3 gas in the reaction chamber is reduced.

Thereby, it is possible to prevent HSG growth from being suppressed in the next HSG forming step.

Too much time is needed to diffuse impurities at a temperature lower than 550° C. in the impurity diffusing step. Also, since the surface of the HSGs is not oxidized, separation of impurities will be greater than absorption thereof at a temperature exceeding 600° C., wherein there are cases where the shape of the HSGs will collapse. Therefore, the impurity diffusing step is carried out at a temperature from 550 through 600° C.

The annealing temperature in the HSG forming step may be substantially equal to that in the impurity diffusing step.

Thus, since it is not necessary to raise or lower the temperature in the reaction chamber, the time required to form capacitor elements can be accordingly reduced, and production efficiency can be improved. Also, since it is possible to prevent particles from being generated in line with raising and lowering of the temperature, highly reliable capacitor elements can be formed.

An etching step for etching the surface area of the HSGs may be further provided before the dielectric body layer forming step. Thereby, the reliability of capacitor elements thus formed can be improved. The etching may be performed in a depth from 1 nm through 5 nm from the surface of the HSGs.

A step for lowering the concentration of impurities on the surface of the HSGs by annealing with reduced pressure may be further provided after the impurity diffusing step. Thereby, the reliability of the capacitor elements thus formed can be improved.

The concentration of impurities on the surface of the HSGs before the dielectric body layer forming step may be set to a value lower than $3 \times 10^{20}$ atoms/cm$^3$. The impurities contained in the source gas may be PH3.

The first silicon forming step may be also provided, before the nucleus forming step, with a step for forming the first silicon layer on the inner wall of a recess held by an insulation layer formed on the semiconductor substrate and for removing at least a part of the insulation layer so that the first silicon layer formed on the inner wall of the recess protrudes from the corresponding recess. Thereby, the formed area of HSGs can be widened to increase the capacitance of the capacitor elements.

A method for producing capacitor elements according to a second aspect of the invention is a method for producing capacitor elements constructed of a lower electrode, a dielectric body layer, and an upper electrode, which are formed on a semiconductor substrate, comprises a first silicon layer forming step for forming a first amorphous silicon layer on the entire surface including the inner wall of a recess on an insulation layer having the recess at an appointed part, a lower electrode rinsing step for rinsing and cleaning the surface of the first silicon layer, a nucleus forming step for forming a second amorphous silicon layer including microcrystal on the surface of the first silicon layer, an HSG forming step for growing HSGs (hemispherical Grains) using microcrystal included in the second silicon layer as a nucleus by annealing the first and second silicon layer at a low pressure or in the atmosphere of an inactive gas, and forming HSGs on the surface of the first silicon layer, an impurity diffusing step for forming a lower electrode by annealing while the HSGs are being exposed to a source gas including impurities and thermally diffusing the impurities in the HSGs, a lower electrode forming step for forming a lower electrode in the recess by etching back the first silicon layer having the HSGs on the surface thereof, a dielectric body layer forming step for forming a dielectric body layer on the surface of the lower electrode, and an upper electrode forming step for forming an upper electrode on the surface of the dielectric body layer, wherein the partial pressure of oxygen and water is maintained at $1 \times 10^{-6}$ Torr or less at least between the HSG forming step and the impurity diffusing step. According to the invention, it is possible to prevent water marks and natural oxide films, etc., from being formed on the surface of HSGs. Therefore, a sufficient amount of impurities can be diffused in the HSGs even at a lower temperature such as, for example, 550° C.

The nucleus forming step, the HSG forming step, and the impurity diffusing step may be carried out in the same reaction chamber of an LPCVD apparatus (low pressure chemical vapor deposition apparatus).

If so, it is possible to easily maintain the partial pressure of oxygen and water in the reaction chamber at $1 \times 10^{-6}$ Torr or less from the nucleus forming step to the impurity diffusing step.

In the nucleus forming step and the HSG forming step, the partial pressure of a remaining PH3 gas in the reaction chamber may be set to $1 \times 10^{-4}$ Torr or less. If so, it is possible to prevent the HSG growth from being suppressed.

After the impurity diffusing step, a step for lowering a remaining PH3 gas in the reaction chamber may be further provided, wherein after the semiconductor substrate is taken out from the reaction chamber, a gas containing silane or disilane is introduced into the reaction chamber. Thereby, it is possible to prevent HSG growth from being suppressed in the next HSG forming step.

A step, in which the minimum temperature on the inner wall of the reaction chamber is kept at 60° C. or more, the PH3 gas adsorbed at a low temperature portion in the reaction chamber is removed, and the remaining PH3 in the corresponding reaction chamber is lowered, may-be further provided. Thereby, it is possible to prevent the HSG growth from being suppressed in the next HSG forming step. Still another step may be provided, where a series of actions are repeated an appointed number of times, in which after the impurity diffusing step, an inactive gas is introduced into the reaction chamber after the semiconductor substrate is taken out from the reaction chamber, the pressure of the reaction chamber is increased and is kept for an appointed period of time, and subsequently the pressure is reduced, the low temperature portion in the reaction chamber is heated to allow the progression of removal of PH3 gas adsorbed on the low temperature portion in the reaction chamber, and the remaining PH3 gas in the reaction chamber is reduced. Thereby, it is possible to prevent the HSG growth from being suppressed in the next HSG forming step.

Too much time is needed to diffuse impurities at a temperature lower than 550° C. in the impurity diffusing step. Also, since the surface of the HSGs is not oxidized, separation of impurities will be greater than absorption thereof at a temperature exceeding 600° C., wherein there are cases where the shape of HSGs will collapse. Therefore, the impurity diffusing step is carried out at a temperature from 550 through 600° C.

The annealing temperature in the HSG forming step may be substantially equal to that in the impurity diffusing step. Thus, since it is not necessary to raise or lower the temperature in the reaction chamber, the time required to form capacitor elements can be accordingly reduced, and production efficiency can be improved. Also, since it is possible to prevent particles from being generated in line with the raising and lowering of the temperature, highly reliable capacitor elements can be formed.

An etching step for etching the surface area of the HSGs may be further provided before the dielectric body layer forming step. Thereby, the reliability of capacitor elements thus formed can be improved. The etching may be performed in a depth from 1 nm through 5 nm from the surface of the HSGs.

A step for lowering the concentration of impurities on the surface of the HSGs by annealing with reduced pressure may be further provided after the impurity diffusing step. Thereby, the reliability of the capacitor elements thus formed can be improved.

The concentration of impurities on the surface of the HSGs before the dielectric body layer forming step may be set to a value lower than $3\times1020$ atoms/cm$^3$. The impurities contained in the source gas may be PH3.

A step for removing at least a part of the insulation layer so that the lower electrode in the recess protrudes from the insulation layer may be also provided before the dielectric body layer forming step. Thereby, the area in which a dielectric body layer is formed is widened to accordingly increase the capacitance of capacitor elements.

Still further, a step for forming a protection material, which protects the inside of the recess when etching back in the corresponding lower electrode forming step, on the first silicon layer having the HSGs may be provided before the lower electrode forming step.

A method for producing capacitor elements according to a third aspect of the invention is a method for producing capacitor elements constructed of a lower electrode, a dielectric body layer, and an upper electrode, which are formed on a semiconductor substrate, comprises a first silicon layer forming step for forming a first amorphous silicon layer on the entire surface including the inner wall of a recess on an insulation layer having the recess at an appointed part, a nucleus forming step for forming a second amorphous silicon layer including microcrystal on the surface of the first silicon layer, an HSG forming step for growing HSGs (hemispherical Grains) using microcrystal included in the second silicon layer as a nucleus by annealing the first and second silicon layer at a low pressure or in the atmosphere of an inactive gas, and forming HSGs on the surface of the first silicon layer, an impurity diffusing step for forming a lower electrode by annealing while the HSGs are being exposed to a source gas including impurities and thermally diffusing the impurities in the HSGS, a lower electrode forming step for forming a lower electrode in the recess by etching back the first silicon layer having the HSGs on the surface thereof, a dielectric body layer forming step for forming a dielectric body layer on the surface of the lower electrode, and an upper electrode forming step for forming an upper electrode on the surface of the dielectric body layer, wherein the partial pressure of oxygen and water is maintained at $1\times10^{-6}$ Torr or less at least between the HSG forming step and the impurity diffusing step. According to the invention, it is possible to prevent water marks and natural oxide films, etc., from being formed on the surface of HSGs. Therefore, a sufficient amount of impurities can be diffused in the HSGs even at a lower temperature such as, for example, 550° C.

The first silicon layer forming step, the nucleus forming step, the HSG forming step, and the impurity diffusing step may be carried out in the same reaction chamber of an LPCVD apparatus (low pressure chemical vapor deposition apparatus).

If so, it is possible to easily maintain the partial pressure of oxygen and water in the reaction chamber at $1\times10^{-6}$ Torr or less from the nucleus forming step to the impurity diffusing step.

In the nucleus forming step and the HSG forming step, the partial pressure of a remaining PH3 gas in the reaction chamber may be set to $1\times10^{-4}$ Torr or less. If so, it is possible to prevent the HSG growth from being suppressed.

After the impurity diffusing step, a step for lowering a remaining PH3 gas in the reaction chamber may be further provided, wherein after the semiconductor substrate is taken out from the reaction chamber, a gas containing silane or disilane is introduced into the reaction chamber. Thereby, it is possible to prevent HSG growth from being suppressed in the next HSG forming step.

A step may be further provided, in which the minimum temperature on the inner wall of the reaction chamber is kept at 60° C. or more, the PH3 gas adsorbed at a low temperature portion in the reaction chamber is degased, and the remaining PH3 in the corresponding reaction chamber is lowered. Thereby, it is possible to prevent the HSG growth from being suppressed in the next HSG forming step. Still another step may be provided, where a series of actions are repeated an appointed number of times, in which after the impurity diffusing step, an inactive gas is introduced into the reaction chamber after the semiconductor substrate is taken out from the reaction chamber, the pressure of the reaction chamber is increased and is kept for an appointed period of time, and subsequently the pressure is reduced, the low temperature portion in the reaction chamber is heated to allow the progression of removal of PH3 gas adsorbed on the low temperature portion in the reaction chamber, and the remaining PH3 gas in the reaction chamber is reduced. Thereby, it is possible to prevent the HSG growth from being suppressed in the next HSG forming step.

Too much time is needed to diffuse impurities at a lower temperature than 550° C. in the impurity diffusing step. Also, since the surface of HSGs is not oxidized, separation of impurities will be greater than absorption thereof at a temperature exceeding 600° C., wherein there are cases where the shape of HSGs will collapse. Therefore, the impurity diffusing step is carried out at a temperature from 550 through 600° C.

The annealing temperature in the HSG forming step may be substantially equal to that in the impurity diffusing step.

Thus, since it is not necessary to raise or lower the temperature in the reaction chamber, the time required to form capacitor elements can be accordingly reduced, and production efficiency can be improved. Also, since it is possible to prevent particles from being generated in line with raising and lowering of the temperature, highly reliable capacitor elements can be formed.

An etching step for etching the surface area of the HSGs may be further provided before the dielectric body layer forming step.

Thereby, the reliability of capacitor elements thus formed can be improved.

The etching may be performed to a depth from 1 nm through 5 nm from the surface of the HSGs.

A step for lowering the concentration of impurities on the surface of the HSGs by annealing with reduced pressure may be further provided after the impurity diffusing step.

Thereby, the reliability of the capacitor elements thus formed can be improved.

The concentration of impurities on the surface of the HSGs before the dielectric body layer forming step may be set to a value lower than $3\times1020$ atoms/cm$^3$.

The impurities contained in the source gas may be PH3.

A step for removing at least a part of the insulation layer so that the lower electrode in the recess protrudes from the insulation layer may be also provided before the dielectric body layer forming step.

Thereby, the area in which a dielectric body layer is formed is widened to accordingly increase the capacitance of capacitor elements.

Still further, a step for forming a protection material, which protects the inside of the recess when etching back in the corresponding lower electrode forming step, on the first silicon layer having the HSGs may be provided before the lower electrode forming step.

A capacitor element according to a fourth aspect of the invention comprises a first electrode formed on a substrate and having, on the surface thereof, HSGs whose concentration of impurities on the surface area is lower than $3 \times 10^{20}$ atoms/cm$^3$, a capacitance insulation layer formed on the first electrode, and a second electrode formed on the interlayered insulation layer.

The HSGs may include impurities, whose concentration is higher than $8 \times 10^{19}$ atoms/cm$^3$ but lower than $3 \times 10^{20}$ atoms/cm$^3$, on the surface area.

The HSGs may include impurities, whose concentration is higher than $8 \times 10^{19}$ atoms/cm$^3$ but lower than $3 \times 10^{20}$ atoms/cm$^3$, in a depth of 10 nm from the surface.

As has been made clear on the basis of the abovementioned description, with the invention, impurities sufficient to prevent depletion of electrodes can be diffused in the HSGs at a low temperature, and operation reliability of the capacitance elements can be improved. Still further, since a low temperature process is applied, it is possible to shorten the time required to raise and lower the furnace temperature, and production efficiency of semiconductor devices can be improved.

BRIEF DESCRIPTION OF THE DRAWINGS

FIG. 6 is a characteristic view of a capacitor element according to the first and second embodiments, and the C(capacitance)-V(voltage) of prior art capacitor elements, FIG. 7 is a characteristic view of a capacitor element according to the first and second embodiments, and the TDDB (Time Dependent-Dielectric-Breakdown) of prior art capacitor elements.

DETAILED DESCRIPTION OF THE PREFERRED EMBODIMENTS

Embodiment 1

Next, a description is given of a production process of a capacitor element according to the first embodiment of the invention with reference to the accompanying drawings.

Figure 1:
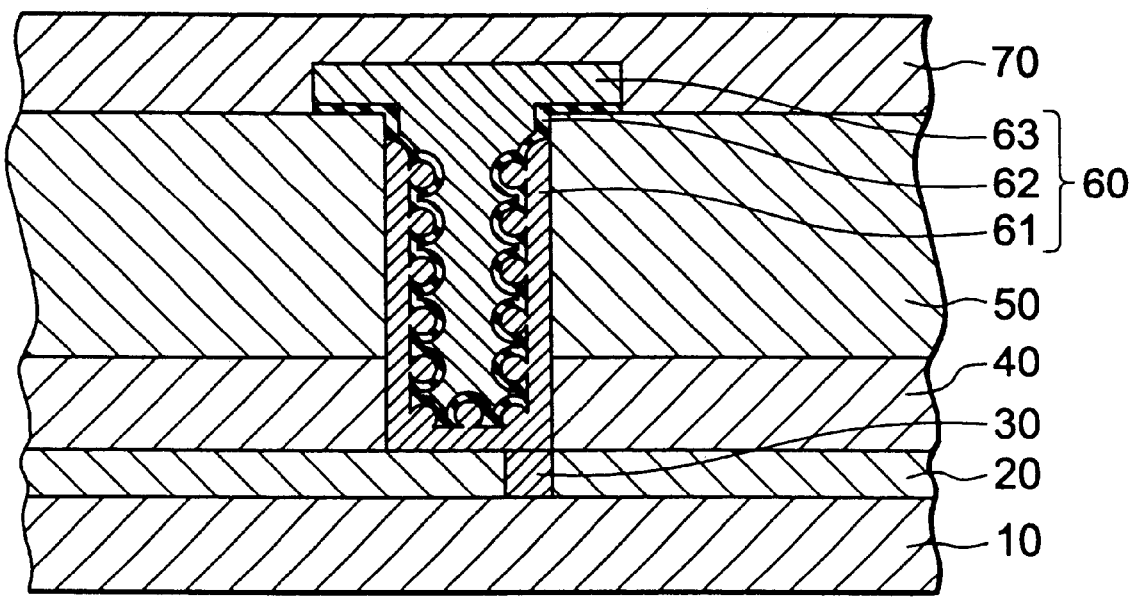
FIG. 1 is a sectional view showing a construction of a capacitor element parasitic area according to a first embodiment.

A capacitor element produced by the production method according to the first embodiment constitutes a memory array of a semiconductor device, for example, a DRAM (Dynamic Random Access Memory). FIG. 1 is a sectional view showing a construction of an area (a capacitor element forming area) where the capacitor element is formed.

As shown in FIG. 1, the capacitor element forming area is constructed of a semiconductor substrate 10, a first interlayered insulation layer 20, a contact plug 30, a second interlayered insulation layer 40, a third interlayered insulation layer 50, a capacitor element 60, and a fourth interlayered insulation layer 70.

The semiconductor substrate 10 is, for example, a silicon substrate on which a plurality of elements (transistors, etc.)(not illustrated) are formed.

The first interlayered insulation layer 20 is formed on the semiconductor substrate 10 and insulates between elements formed on the semiconductor substrate 10, and between wiring on the surface of the semiconductor substrate 10 and upper-layered wiring. Also, the first interlayered insulation layer 20 has, for example, a contact hole reaching a diffusion layer area of transistors formed on a semiconductor substrate 101. In addition, the material of the first interlayered insulation layer 20 is, for example, BPSG (Borophosphosilicate Glass).

The contact plug 30 is formed of, for example, polysilicon, and is formed in the contact hole of the first interlayered insulation layer.

The second interlayered insulation layer 40 is formed of, for example, USG (Undoped Silicate Glass) and is formed on the first interlayered insulation layer. Also, the second interlayered insulation layer 40 has a hole to form a capacitor element 60 in an area including an area above the contact plug 30.

The third interlayered insulation layer 50 is formed of BPSG, USG or a laminated layer of these materials, and is formed on the second interlayered insulation layer 40. In addition, the third interlayered insulation layer 50 has a hole to form a capacitor element 60, at a portion corresponding to the hole of the second interlayered insulation layer 40.

The capacitor element 60 is formed in the hole of the second interlayered insulation layer 40 and that of the third interlayered insulation layer 50. The capacitor element 60 consists of, as shown in FIG. 1, a lower electrode 61, a capacitance insulation layer 62 and an upper electrode 63. The lower electrode 61 is constructed of, for example, silicon containing impurities and has HSGs (Hemispherical Grains) on the surface thereof. Also, the lower electrode 61 is formed on the inner walls of the holes of the second interlayered insulation layer 40 and the third interlayered insulation layer 50. And, it is connected to the contact plug 30. In addition, a diffusion barrier film (not illustrated) is formed, to prevent impurities from being diffused outward, on the surface of the lower electrode 61. The capacitance insulation layer 62 is formed on the lower electrode 61 and is formed of, for example, silicon nitride. The upper electrode 63 is formed o the capacitance insulation layer 62 and is formed of, for example, silicon containing impurities.

The fourth interlayered insulation layer 70 is composed of, for example, BPSG, and is formed on the third interlayered insulation layer 50 so as to cover the capacitor element 60.

Next, a description is given of a method for producing a capacitor element forming area, which is constituted as described, with reference to FIG. 2.

Figure 2A:
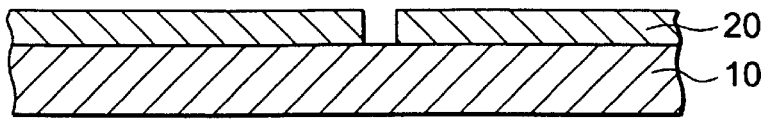
FIG. 2 is a sectional view showing respective production processes of a capacitor element parasitic area illustrated in FIG. 1.

First, the first interlayered insulation layer 20 is formed on a semiconductor substrate 10 on which transistors (not illustrated) are formed, by using a CVD (Chemical Vapor Deposition) method, etc. And, a contact hole as shown in FIG. 2(a) is formed at, for example, a diffusion area of the transistors on the first interlayered insulation layer 20 by photolithography or etching, etc.

Figure 2B:
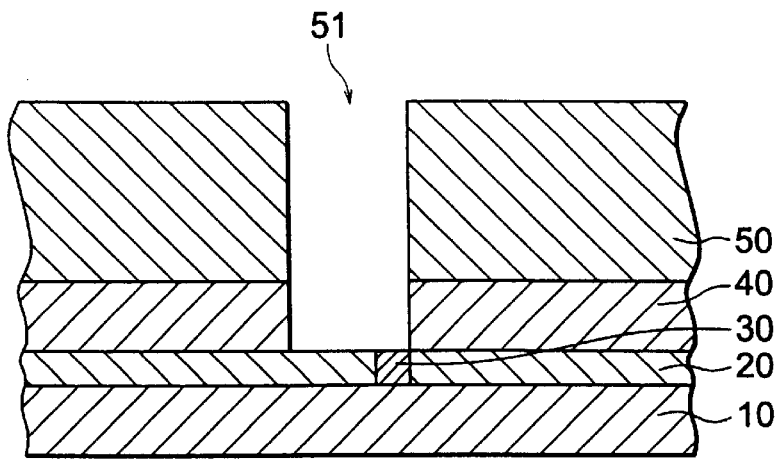

Next, a polysilicon film is formed, by a CVD method, etc., in the contact hole of the first interlayered insulation layer, and on the first interlayered insulation layer. And, the polysilicon film on the surface of the first interlayered insulation layer 20 is removed by a CMP (Chemical Mechanical Polishing) method, etc., wherein a contact plug 30 is formed as shown in FIG. 2(b).

Subsequently, the second interlayered insulation layer 40 and the third interlayered insulation layer 50 are formed on the first interlayered insulation layer 20 in the order by the CVD method, etc. And, as shown in FIG. 2(b), a hole (recess) 51 to form a capacitor element 61 is formed at an area including an area above the contact plug 30, by using photolithography or an etching process, etc.

Figure 2C:
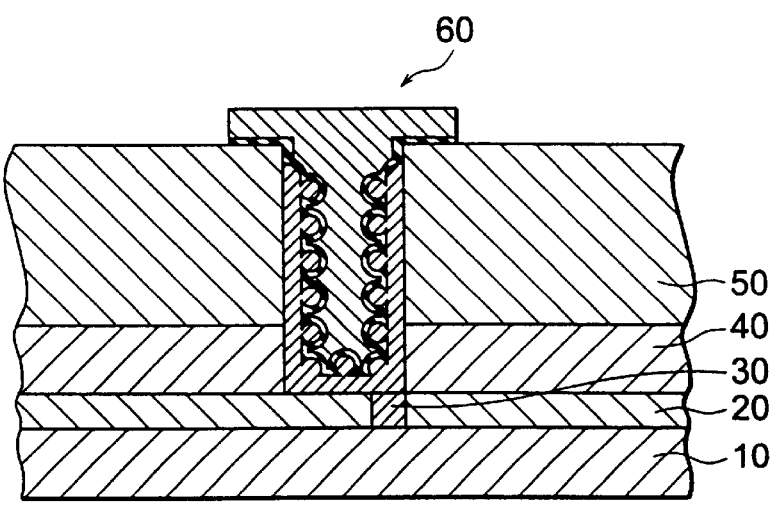
Figure 2D:
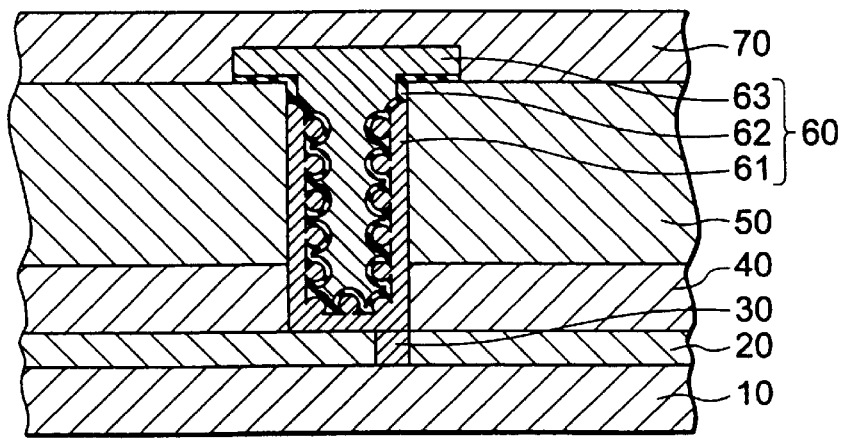

After the hole 51 is formed, the capacitor 60 is formed in the hole 51 as shown in FIG. 2(c). Also, a method for producing a capacitor element 60 is described later.

As shown in FIG. 2(c), after the capacitor element 60 is formed, the fourth interlayered insulation layer 70 is formed by a CVD method, etc., to complete a capacitor element forming area as shown in FIG. 1.

Next, a description is given of a method for producing the abovementioned capacitor element 60.

FIG. 3 is a sectional view showing respective production processes of the capacitor element 60. FIG. 4(a) is a flow chart showing respective production processes of the capacitor element 60 while FIG. 4(b) is a flow chart showing a prior art production process, which is prepared to clarify differences between the present embodiment and the prior art.

Figure 3A:
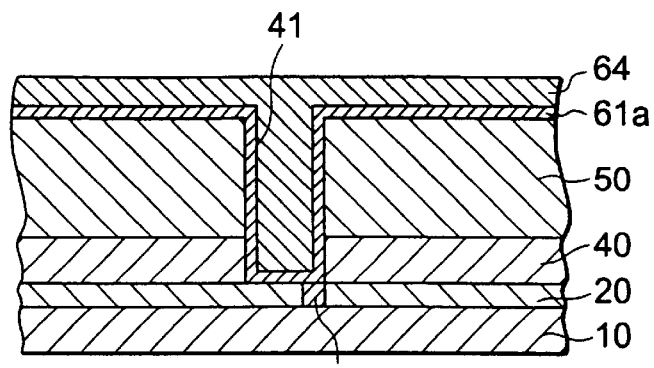
FIG. 3 is a sectional view showing respective production processes of a capacitor element illustrated in FIG. 1 and FIG. 2.
Figure 4B:
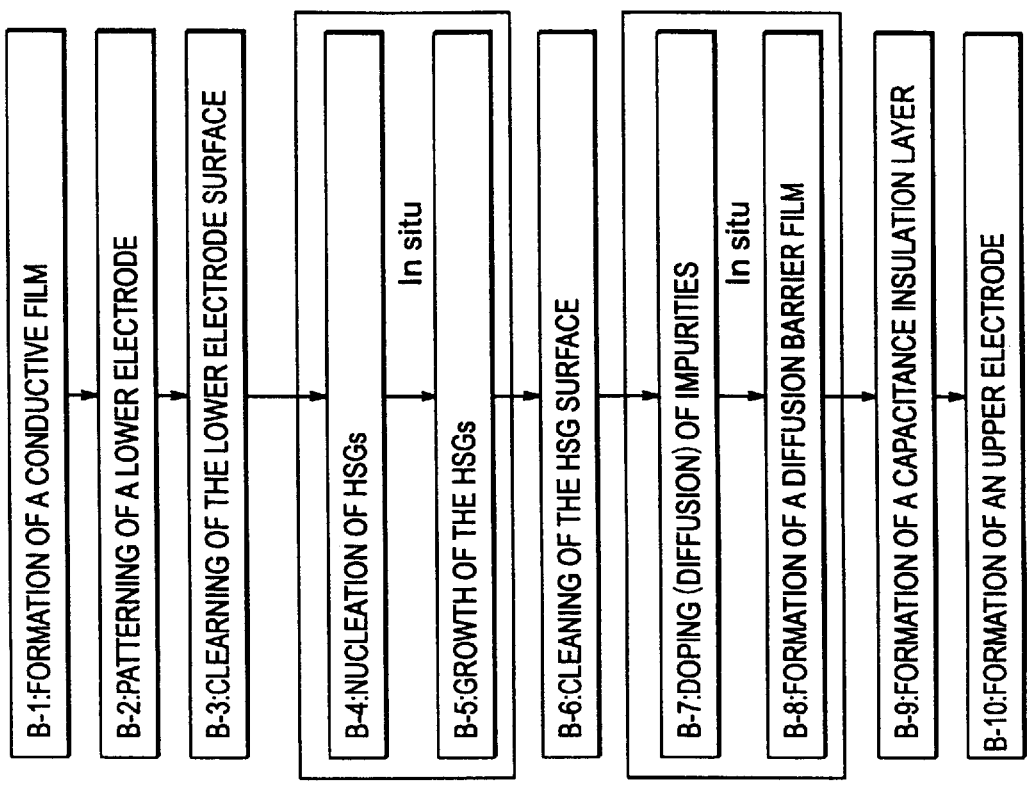
FIG. 4B is a flow chart showing one example of the prior art production processes.
Figure 4A:
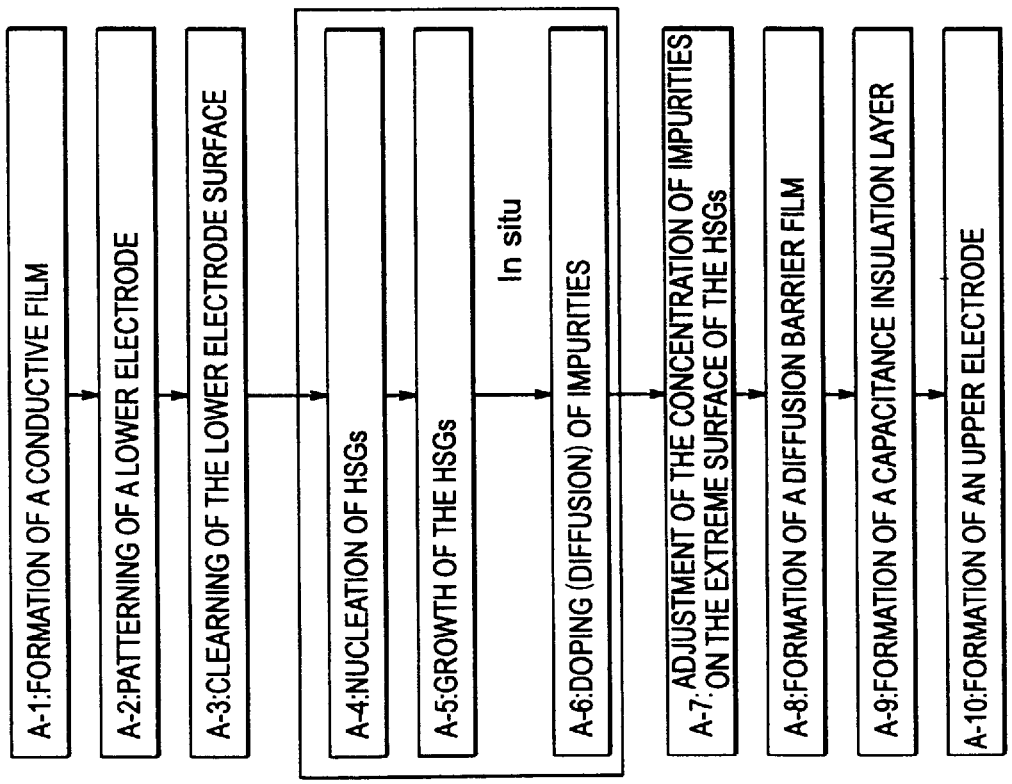
FIG. 4A is a flow chart showing respective production processes of a capacitor element illustrated in FIG. 1 and FIG. 2.

As shown in FIG. 3(a), after the hole 51 is formed as described above, an amorphous silicon layer 61a (conductive film) is formed in the hole 51 and on the third interlayered insulation layer 50 by the CVD method, etc. (Step A-1 in FIG. 4). Also, the silicon layer 61a contains, for example, phosphorus, whose concentration is 1×1020 atoms/cm³, as impurities.

Next, as shown in FIG. 3(a), a positive type photoresist 64 is formed on the silicon layer 61a by a spin-coat method, etc.

Figure 3B:
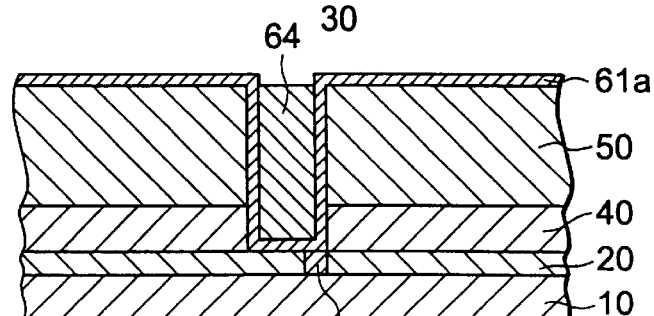

Subsequently, the photoresist 64 is exposed under adequate conditions and developed, whereby the photoresist 64 is left in only the hole 51 as shown in FIG. 3(b). Also, the remaining photoresist 64 in the hole 51 will protects the inside of the hole 51 in the next etching-back process.

Figure 3C:
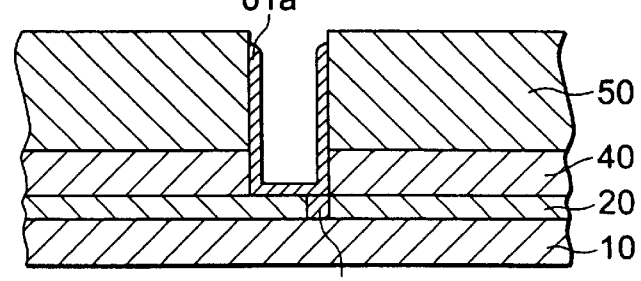

Thereafter, as shown in FIG. 3(c), by etching back the entire surface, the silicon layer 61a is patterned (Step A-2 in FIG. 4) to remove the photoresist 64 in the hole 51.

After the photoresist 64 is removed, using a fluoric acid diluted with water, the surface of the silicon layer 61a is etched in a depth of approx. 6 nm or more in terms of thermal oxidation film. Thereby, the surface of the silicon layer 61 is cleaned by removing natural oxide films on the surface) Step A-3 in FIG. 4). Also, silicon atoms of the silicon layer 61a are hydrogen-terminated by using a fluoric acid. That is, the silicon layer 61a is chemically stabilized, whereby the surface can be kept clean for several hours in a clean atmosphere at a normal temperature.

Figure 3D:
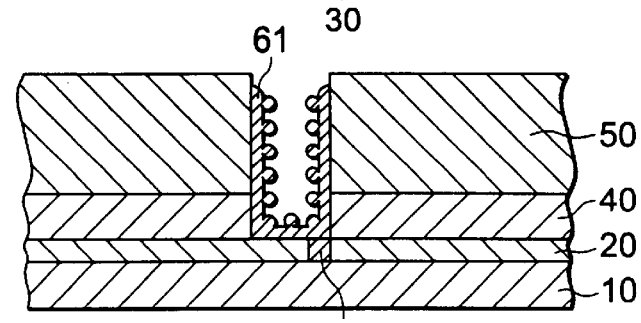

After cleaning the silicon layer 61, as described below, HSG nucleation is carried out on the surface of the silicon layer 61a (Step A-4 in FIG. 4), thereby forming HSGs (Step A-5 in FIG. 4). And, impurities (phosphorus) is injected and diffused in HSGs by annealing using phosphine (PH3) (Step A-6 in FIG. 4). Thereby, as shown in FIG. 3(d), the lower electrode 61 is formed.

Processes from nucleation of the abovementioned HSGs to diffusion of the impurities into the HSGs (From step A-4 through Step A-6 in FIG. 4) are thoroughly and consistently carried out in an LP-CVD (Low Pressure-Chemical Vapor Deposition) apparatus (furnace) having a load lock which can be vacuumed. By consistently performing the processes from nucleation of the abovementioned HSGs to diffusion of the impurities into the HSGs (From step A-4 through Step A-6 in FIG. 4) in the same furnace, it is possible to keep the partial pressure of water and oxygen at a very low level. Therefore, natural oxide films, etc., are hardly formed on the HSG surface, wherein after the HSGs are formed, no need to clean the HSG surface by using a fluoric acid will be generated. Also, by removing the cleaning process by a fluoric acid, etc., no water mark is formed on the HSG surface.

On the other hand, in the prior art production method, as shown in FIG. 4(b), HSG growth (nucleation) (Step B-5) and diffusion of impurities (Step B-7) are carried out in different furnaces. Therefore, the surface of HSGs is cleaned by a fluoric acid, etc. (Step B-6) after the HSGs are nucleated. Accordingly, in the prior art production method, water marks and/or natural oxide films, etc., will be generated on the HSG surface.

In addition, in experiments made by the inventor, etc., it has been found that, as the partial pressure of water and oxygen exceeds $1 \times 10^{-6}$ Torr, it is difficult to diffuse a sufficient amount of phosphorus in the HSGs at a low temperature (for example, 600° C. or less). On the other hand, it has been found that a sufficient amount of phosphorus can be diffused in the HSGs at a low temperature by keeping the partial pressure of oxygen and water at $1 \times 10^{-6}$ Torr or less. Therefore, the HSG forming step and impurity diffusing step described below are carried out at a low temperature(for example, 550 through 600° C.).

Figure 5:
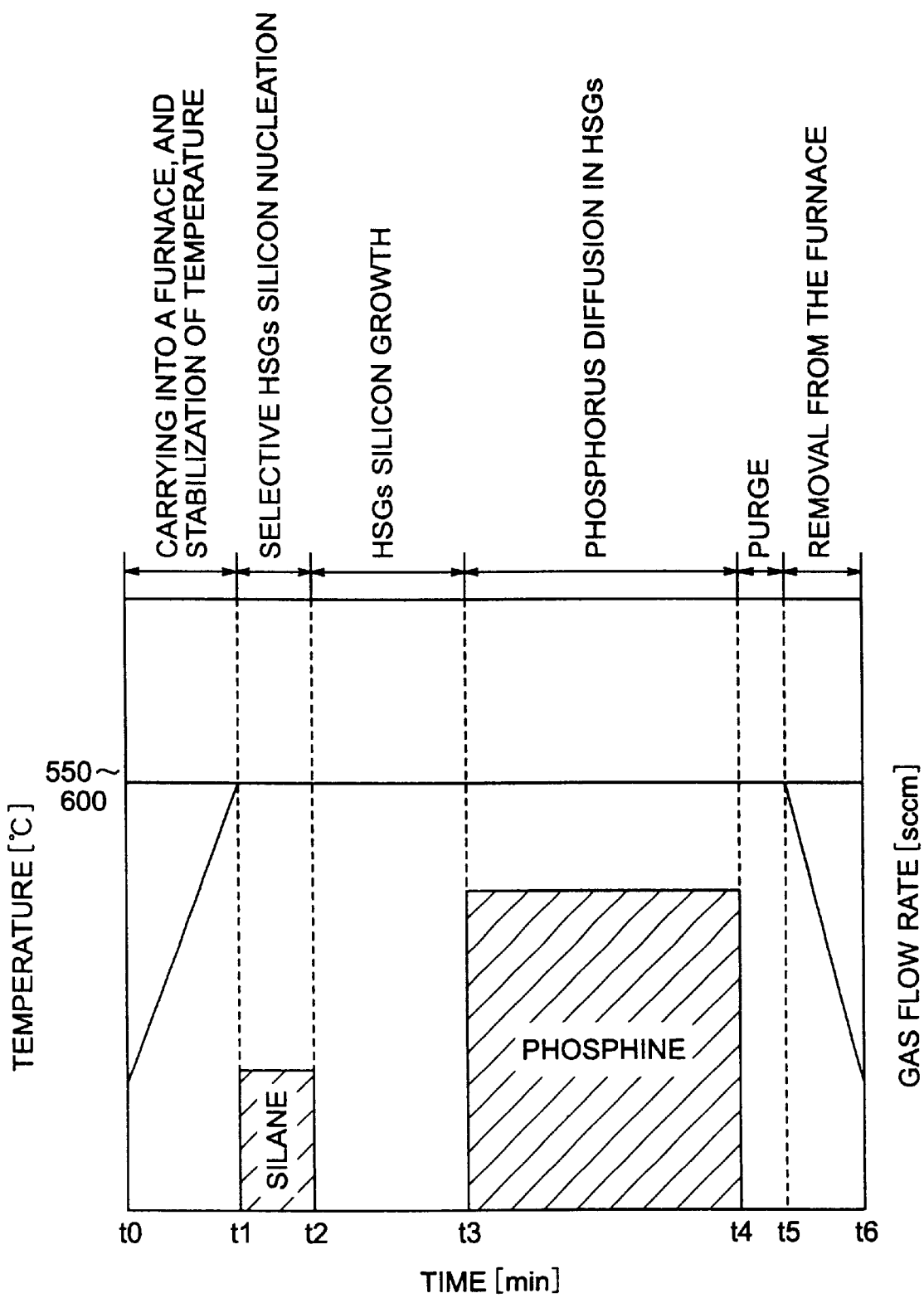
FIG. 5 is a timing chart showing a production process from FIG. 3C to FIG. 3D.

FIG. 5 is a timing chart showing processes from nucleation of HSGs, which is performed in an LP-CVD furnace, to diffusion of impurities into HSGs (Steps A-4 through A-6 in FIG. 4).

First, a wafer, which resides in the state shown in FIG. 3(c), having a clean silicon layer 61a formed on the surface thereof is carried into an LP-CVD furnace (t0). Also, before taking the wafer into the furnace, the partial pressure of water and oxygen is set to $1\times10^{-6}$ Torr or less as described above.

After the wafer is carried into the furnace, it is heated to an appointed temperature (for example, 550 through 600° C.), and an operator waits until the temperature is stabilized (t0 and t1). Also, since the partial pressure of water and oxygen is Set to $1\times10^{-6}$ Torr or less as the temperature rises, it is possible to suppress oxidization of the surface of the silicon layer 61a.

Next, silane ($SiH_4$) is introduced into the furnace at a flow rate of 70 sccm with the temperature in the furnace kept at an appointed temperature level (in detail, for example, 560° C.). And, while the pressure in the furnace is kept at approx. 1 m Torr, layer formation is continued for approx. 20 minutes (t1 and t2). Thus, by forming a layer under a comparatively low pressure, amorphous silicon containing microcrystal is caused to selectively grow 6 through 10 nm thick on the silicon layer 61a) Step A-4 in FIG. 4). In addition, microcrystal formed in this process will become a nucleus causing HSGs to grow in the next process.

Next, introduction of silane is stopped, the pressure in the furnace is set to $1\times10^{-7}$ Torr or less, and annealing is carried out for an appointed period of time (for example, 50 minutes) (t2 and t3). Thereby, the HSGs are caused to grow, using amorphous silicon microcrystal formed on the silicon layer 61a as a nucleus (Step A-5 in FIG. 5). Also, the grain size of the HSGs can be controlled by adjusting the annealing time.

After the HSGs are grown, a phosphine gas diluted to approx. 1% by nitrogen is introduced into the furnace at a flow rate of 300 sccm or so. And, the pressure in the furnace is set to approx. 3 Torr and is retained for approx. 60 minutes (t3 and t4), whereby phosphorus is diffused in the HSGs as impurities (Step A-6 in FIG. 4).

And, the remaining gas in the furnace is purged (t4 and t5), and the temperature in the furnace is lowered to the removal temperature (t5 and t6), wherein the wafer is taken out of the furnace (t6).

By the abovementioned processes, as shown in FIG. 3(d), a lower electrode 61 having HSGs on one side thereof is formed.

After the wafer on which the lower electrode 61 is formed is take away from the furnace, the surface of the HSGs of the lower electrode is removed by approx. 1 through 5 nm by the APM (ammonia and peroxide solution) process. Thus, by removing a dense portion where the concentration of impurities is high on the surface of the HSGs, the concentration of impurities of the HSG surface can be adjusted (Step A-7 in FIG. 4). Thereby, as described below, it is possible to improve the reliability of operation of the capacitor elements. Also, after the surface of the HSG is removed, the concentration of impurities contained in the surface area (an area approx. 10 nm deep from the HSG surface) of the lower electrode 61 is approx. $1\times10^{20}$ atoms/cm$^3$.

Next, a diffusion barrier film (RTN film) (not illustrated) is formed on the surface of the lower electrode 61 by, for example, RTN (rapid thermal nitrifying) process (Step A-8 in FIG. 4). By this diffusion barrier film, the impurities can be prevented from being re-diffused outside the HSGs.

Figure 3E:
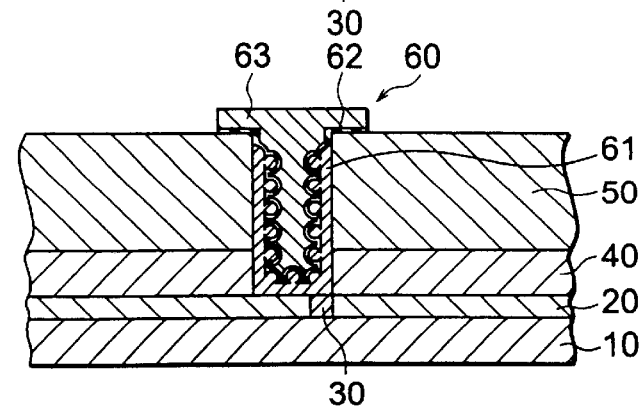

After the diffusion barrier film is formed, as shown in FIG. 3(e), a capacitance insulation layer 62 is formed on the lower electrode 62 (Step A-9 in FIG. 4). In the process, a nitrified silicon layer is formed approx. 6 nm thick on the lower electrode by, for example, the LP-CVD method. And, by carrying out a RTO (rapid thermal oxidizing) process at approx. 750° C. for approx. 60 minutes, the capacitance insulation layer 62 is formed.

Subsequently, a silicon layer including impurities is formed on the capacitance insulation layer 62 by the LP-CVD method, etc. The silicon layer is patterned by photo lithography or an etching process, wherein an upper electrode 63 is formed as shown in FIG. 3(e) (Step A-10 in FIG. 4) to complete a capacitor element 60.

After the capacitor element 60 is formed, as shown above (in FIG. 2(d)), the fourth interlayered insulation layer 70 is formed on the third interlayered insulation layer 50 so as to cover the capacitor element 60, thereby completing a capacitor element forming area.

FIG. 6 is a C(capacitance)-V(Voltage) characteristic view of the capacitor element thus formed. Also, biases in the abscissa shown in FIG. 6 express the magnitude in voltage applied on the upper electrode where it is assumed that the voltage applied to the lower electrode of the capacitor element is 0 V.

As shown in FIG. 6, in the capacitor element for which no diffusion (annealing) of the impurities (PH3) is carried out, the lowering of capacitance is remarkable when a negative bias is applied. This indicates that the impurities on the lower electrode are slight, and depletion has occurred. Also, in the capacitor element having no HSG, although the capacitance is almost fixed regardless of the intensity of the bias, the total capacitance is slight. On the other hand, in the capacitor element 60 according to the first preferred embodiment, although the capacitance is almost fixed regardless of the intensity of the bias, the value is great in total. That is, by forming HSGs on the lower electrode, the capacitance of the capacitor element 60 is increased, whereby the depletion of the lower electrode 61 has been considerably suppressed by the impurities.

FIG. 7 is a view showing the TDDB (Time Dependent Dielectric Breakdown) characteristics of a capacitor element by the Weilbull plotting method. In addition, the SPM rinsing shown in FIG. 7 is a process in which HSGs are rinsed with a sulfuric acid and peroxide solution to remove phosphine adsorbed on the HSG surface.

As shown in FIG. 7, in the case where a diffusion barrier film (RTN film) is formed as it is after the impurities (PH3) are diffused (annealed), the service life of the capacitor element is shorter in comparison to a case where the APMP process is carried out without injecting impurities into the HSGs. Also, in the case where the SPM process is carried out with almost no etching on the HSG surface, the service life of the capacitor elements can not be improved. On the other hand, in the case where the APM process is performed after diffusion of the impurities, the service life of the capacitor element becomes very long in comparison to the other cases. That is, as described above, by carrying out the APM process after diffusing impurities into the HSGs, and removing the HSG surface of the lower electrode 61 to a depth of approx. 1 through 5 nm, it is found that the operational reliability of the capacitor elements can be improved.

Based on the above description, by etching the surface-area of the HSGs, removing dense portions having a high concentration of impurities, and making the concentration of impurities of the surface area of the HSGs smaller than $3\times10^{20}$ atoms/cm$^3$, it is found that the reliability of capacitor elements can be maintained and the depletion of electrodes can be suppressed.

As described above, it is possible to diffuse impurities into HSGs in amounts sufficient to suppress depletion of the lower electrode 61 at a lower temperature than that of the prior arts. Thereby, the capacitance of the capacitor element can be increased to improve the operation reliability of the capacitor element 60.

In addition, as described above, since the HSG formation step and HSG impurity diffusing step are carried out at a lower temperature than that of the prior arts, it is possible to reduce the frequency of raising or lowering the temperature when bringing wafer into or out of the furnace, whereby the time required to raise and lower the temperature can be shortened when brining the wafer into or out of the furnace. Therefore, efficiency of capacitor element production can be improved.

Further, since the frequency of raising or lowering the temperature when bringing the wafer into or out of the furnace is reduced, particles are scarcely generated in the furnace, whereby almost no particles are adhered to the film surface when forming the capacitor elements 60, and operational reliability of the capacitor elements 60 can be improved.

In normal production methods, it is almost impossible to diffuse phosphorus into amorphous silicon at such a low temperature (600° C. or less). However, in the abovementioned production method, sufficient phosphorus can be diffused in the HSGs. Although a detailed mechanism of the diffusion of phosphorus is not clear, it is considered, as a result of an observation made by the inventors et al., using a TEM (Transparency type electron microscope), that a number of defects such as twin crystal, etc. radially extending from the center are observed. Based thereon, it is considered that there is a possibility that these defects produced in the HSGs become diffusion channels for the impurities. However, it is considered that, if the HSG surface is very slightly oxidized, such diffusion is hindered. That is, as described above, the processes from nucleation of the HSGs to diffusion of impurities into the HSGs are carried out in the same furnace, and the partial pressure of water and oxygen is kept at a very low level, whereby it is considered that oxidization of the HSG surface can be suppressed, and sufficient phosphorus is diffused into the HSGS at a low temperature.

Embodiment 2

Next, a description is given of a method for producing capacitor elements according to the second embodiment of the invention with reference to the accompanying drawings.

The construction of the capacitor element forming area is substantially the same as that of the first embodiment. In addition, in the method for producing a capacitor element forming area, the processes in which the first interlayered insulation layer 20, contact plug 30, second interlayered insulation layer 40, and third interlayered insulation layer 50 are formed on a semiconductor substrate 10, and a process in which a hole 51 to form a capacitor element 60 are the same as those in the first embodiment.

In the second embodiment, the step for producing a capacitor element 60 after forming the hole 51 is different from that in the first embodiment. FIG. 8 is a sectional view showing the respective production processes for a capacitor element 60 in the second embodiment, and FIG. 9 is a flow chart showing the respective production processes for a capacitor element 60 in the second embodiment.

Figure 8A:
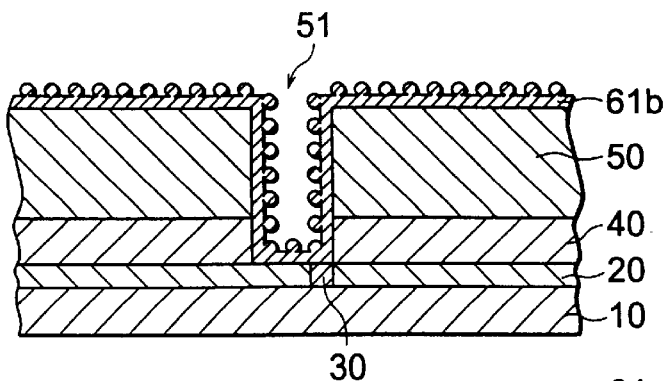
FIG. 8 is a sectional view showing respective production processes of a capacitor element according to the second embodiment.
Figure 9:
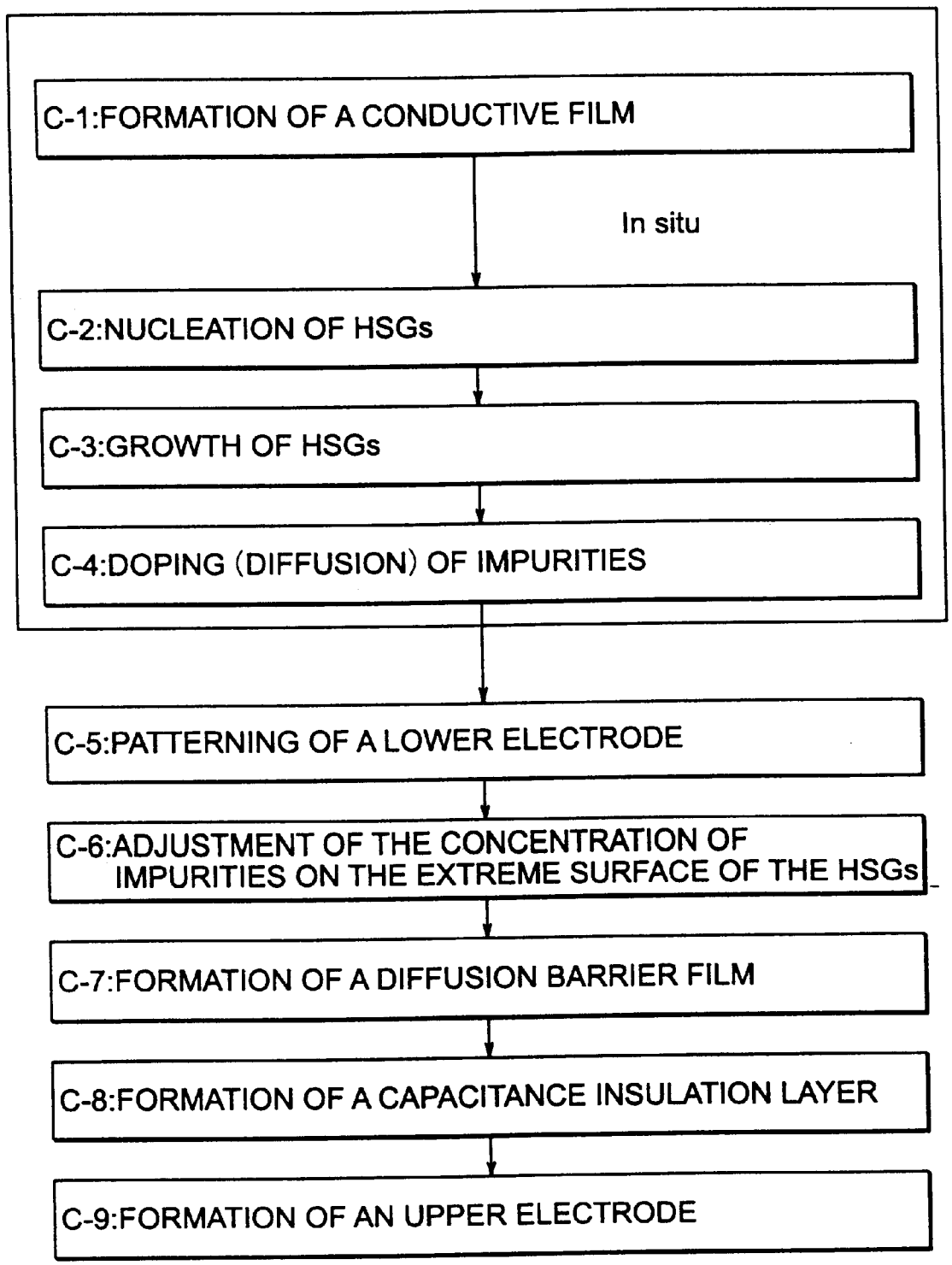
FIG. 9 is a flow chart showing respective production processes of a capacitor element according to the second embodiment.
Figure 10:
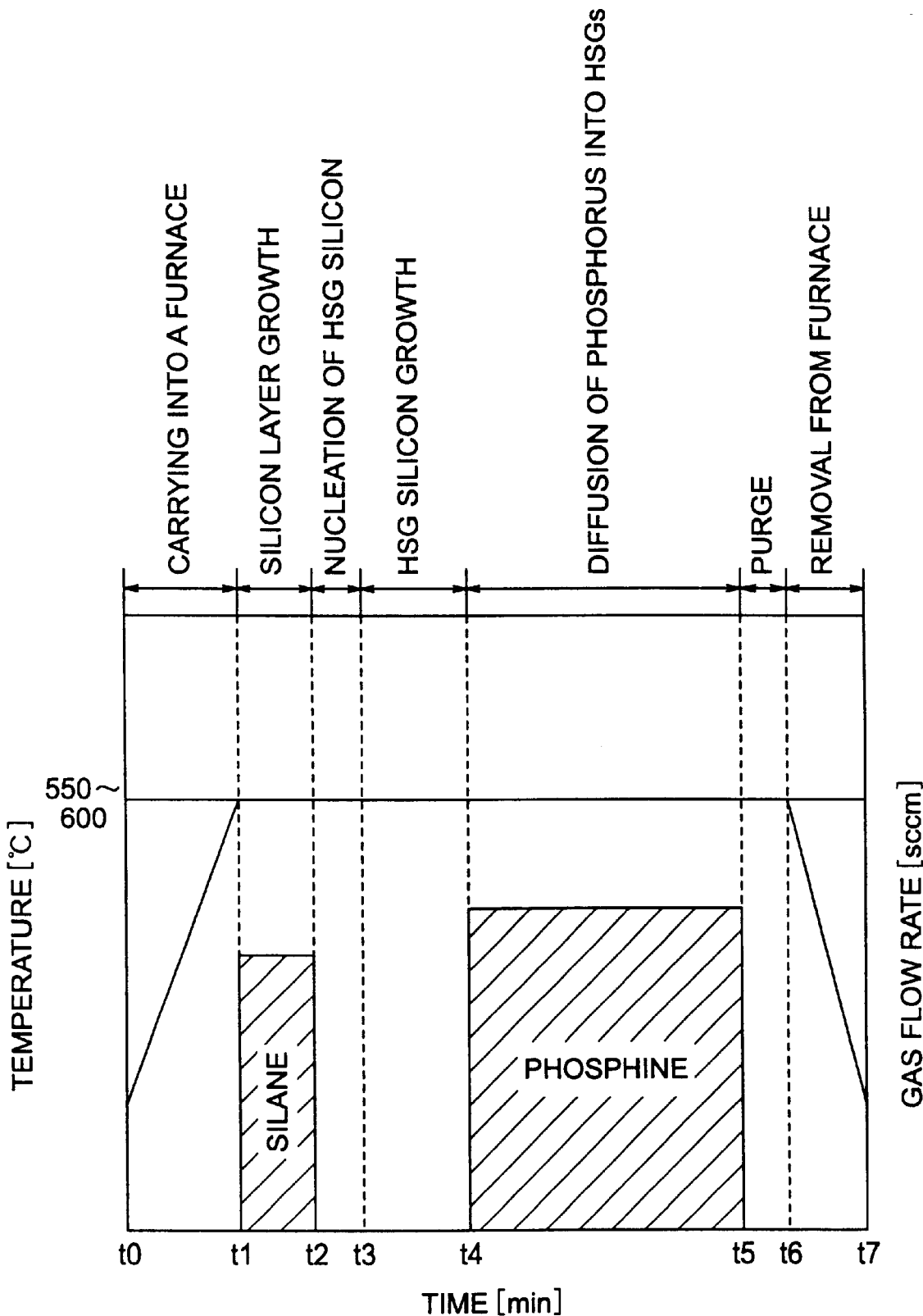
FIG. 10 is a timing chart showing a production process illustrated in FIG. 8.

In the second embodiment, as shown in FIG. 9, differing from the prior art production method (as shown in, for example, FIG. (b)) and the first embodiment, processes from formation of a conductive film (Step C-1) through to diffusion (injection) of impurities into HSGs (Step C-4) are carried out in the same furnace. In detail, a wafer having the hole 51 formed (FIG. 2(c)) is carried in a normal,CVD apparatus (furnace). And, as shown below, a silicon layer 61b (conductive film) containing impurities having HSGs on the surface thereof is formed in the hole 51 and on the third interlayered insulation layer 50 as shown in FIG. 8(a). Also, before bringing the wafer into the furnace, the partial pressure of water and oxygen in the furnace is set to $1 \times 10^{-6}$ Torr as in the first embodiment. The processes (Steps C-2 through C-4 in FIG. 9) from nucleation of the HSGs to diffusion thereof into the HSGs are carried out at a low temperature (for example, 550 through 600° C.). FIG. 10 is a timing chart showing a formation process of a silicon layer 61b which is performed in the CVD furnace.

After the water having the hole 51 formed thereon is carried in the CVD furnace, the wafer is heated to an appointed temperature (for example, 550 through 600° C.), and stabilization of the temperature is awaited (t0 and t1).

Next, with the temperature in the furnace kept at an appointed temperature (in detail, 570° C.), for example, a silane gas is introduced into the furnace, and the pressure in the furnace is kept at approx. 0.5 Torr (t1 and t2), whereby an amorphous silicon layer 61b containing no impurities is formed approx. 20 nm thick in the hole 51 and on the third interlayered insulation layer 50 (Step C-1 in FIG. 9). Also, by forming the silicon layer 61b on the entire surface, influences due to water, etc., emitting from the interlayered insulation layers can be minimized. In a low-temperature process as in the invention, there can be a case where water is not sufficiently discharged from the interlayered insulation layers. Therefore, in order to get the partial pressure of water and oxygen in the furnace to a low level in the case where the silicon layer 61b is formed at least on a part of the interlayered insulation layers (for example, the first embodiment), a pump having high exhaust power such as a turbo molecule pump, etc., must be additionally provided. But, by forming the silicon layer 61 on the entire surface, it is possible to set the partial pressure of water and oxygen in the furnace to a low level by using a normal CVD furnace.

After the silicon layer 61b is formed, introduction of silane gas is stopped, and the pressure in the furnace is reduced to, for example, $1 \times 10^{-2}$ Torr, whereby an amorphous silicon layer containing microcrystal which will become the nucleus of HSG growth is formed on the surface of the silicon layer 61b, using the remaining silane gas in the CVD furnace (Step C-3 in FIG. 9).

Subsequently, the pressure in the furnace is set to, for example, $1 \times 10^{-2}$ Torr and annealing is carried out for an appointed period of time (for example, 50 minutes) (t3 and t4), whereby HSGs are caused to grow, using microcrystal of amorphous silicon formed on the surface of the silicon layer 61b as a nucleus (Step C-3 in FIG. 9) Also, the grain size of the HSGs can be controlled by adjusting the annealing time.

After the HSGs are grown, phosphine diluted to approx. 1% by nitrogen is introduced into the furnace at a flow rate of approx. 500 sccm. And, the pressure in the furnace is set to approx. 5 Torr, and annealing is carried out for approx. 30 minutes (t4 and t5). Therefore, impurities (Phosphorus) are injected and diffused in the silicon layer 61b having no impurity but having HSGs on the surface thereof (Step C-4 in FIG. 9).

And, the remaining gas in the furnace is purged (t5 and t6), the temperature in the furnace is lowered to the wafer removing temperature (t6 and t7), and the wafer is removed from the furnace (t7).

As described above, processes from formation of a conductive film to diffusion of impurities into the HSGs (Steps C-1 through C-4 in FIG. 9) are carried out in the same furnace. As shown in FIG. 8(a), a silicon layer 61b containing impurities is formed.

Figure 8B:
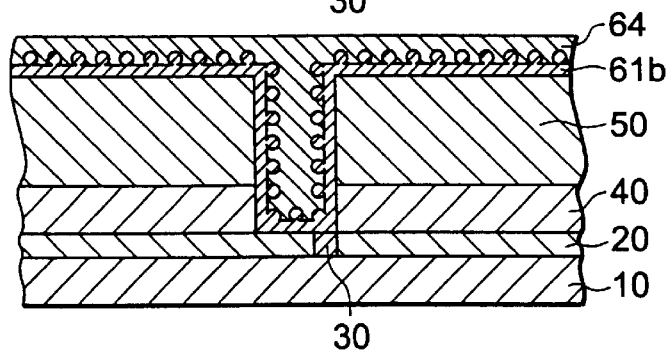

After the silicon layer 61b is formed, a positive type photoresist 64 is formed on the silicon layer 61b by the spin-coating method, etc., as shown in FIG. 8(b).

Figure 8C:
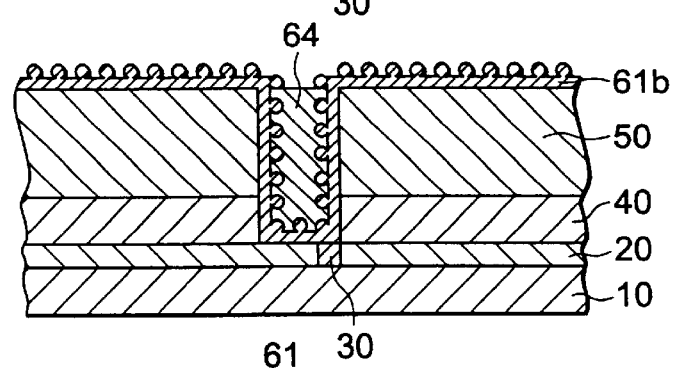

And, the photoresist 64 is exposed under adequate exposure conditions and developed, thereby leaving the photoresist 64 in only the hole 51 as shown in FIG. 8(c).

Figure 8D:
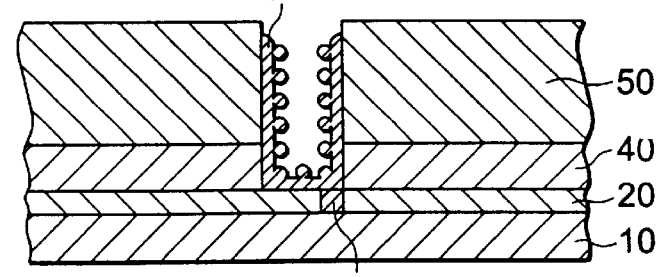

Thereafter, by etching the entire surface, the silicon layer 61b is patterned as shown in FIG. 8(d) (Step C-5 in FIG. 9), and the lower electrode 61 is formed. And, as shown in FIG. 8(d), the photoresist 64 in the hole 51 is removed.

After the photoresist 64 is removed, the HSG surface of the lower electrode 61 is etched to a depth of approx. 1 through 5 nm, and the concentration of the impurities on the extreme surface of the HSGs is adjusted (Step C-6 in FIG. 9). Also, etching is performed by, for example, a combination of a peel-off process by sulfuric acid and the AMP process shown in the first embodiment, whereby a dense portion having a high concentration of the impurities on the HSG surface is removed, and operating reliability of the capacitor element 60 can be improved as in the first embodiment.

Figure 8E:
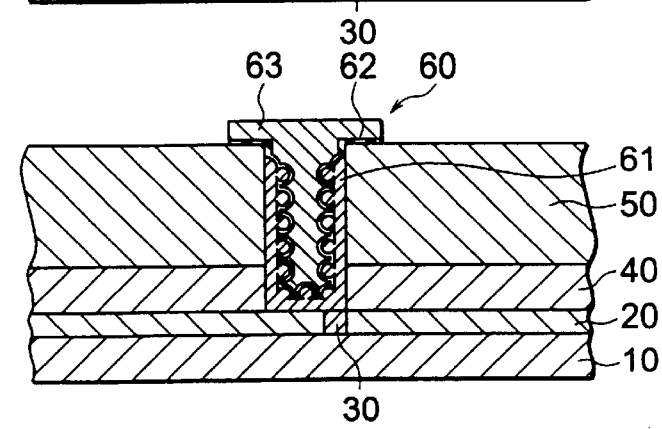

Thereafter, a diffusion barrier film (RTN film) (not illustrated) is formed on the surface of the lower electrode 61 as in the first embodiment (Step C-7 in FIG. 9). And, as in the first embodiment, a capacitance insulation layer 62 and an upper electrode 63 are formed on the lower electrode 61 on which the diffusion insulation layer is formed (Steps C-8 and C-9 in FIG. 9), whereby the capacitor element 60 is thus completed as shown in FIG. 8(e).

After the capacitor element 60 is completed, as described above (FIG. 2(c)), the fourth interlayered insulation layer 70 is formed on the third interlayered insulation layer 50 so as to cover the capacitor element 60, thereby completing the capacitor element forming area.

FIG. 6 shows a C(capacitance)-V(Voltage) characteristic view of the capacitor element 60 formed as described above.

As shown in FIG. 6, a change in capacitance resulting from a bias is made smaller than that in the first embodiment. That is, it is found that depletion of the lower electrode 61 has been further reduced or suppressed in the second embodiment than that in the first embodiment.

In addition, the TDDB characteristics of the capacitor element 60 thus formed were almost the same as those in the first embodiment. That is, as described above, if the extreme surface of the HSGs is etched by a combination of a peel-off process by sulfuric acid and the APM process, the service life of the capacitor element 60 can be lengthened further than that of the prior arts.

As described above, impurities sufficient to suppress depletion of the lower electrode 61 can be diffused into the HSGs at a lower temperature than in the prior arts. Therefore, the capacitance of the capacitor element 60 is increased, and operating reliability of the capacitor element 60 can be improved.

Also, as described above, since the process from formation of a conductive film to diffusion of impurities into the HSGs are carried out at a lower temperature than in the prior arts, the frequency of raising and lowering the temperature when bringing the wafer in and out of the furnace is reduced. Therefore, the time required to raise and lower the temperature when bringing the wafer in or brining it out of the furnace can be shortened, whereby production efficiency of the capacitor element can be improved.

Furthermore, since the frequency to raise and lower the temperature when bringing wafer in or out of the furnace is low, almost no particles are generated in the furnace, whereby almost no particles adhere onto the film surface when forming the capacitor element 60, and operating reliability of the capacitor element 60 can be improved.

Also, in the HSG forming step and impurity diffusing step, since a silicon layer 61b is formed on the entire surface of the interlayered insulation layers as described above, it is possible to set the partial pressure of water and oxygen in the furnace to a low level, using a normal CVD furnace. Accordingly, production cost of the furnace can be kept low.

Embodiment 3

Next, a description is given of a method for producing a capacitor element according to the third embodiment of the invention with reference to the drawings.

In the third embodiment, the method for producing a capacitor element forming area is identical to that in the first or second embodiment. In the third embodiment, the time required from removal of the wafer to which the above process is applied in a CVD furnace or an LP-CVD furnace to carry-in of the wafer to which a subsequent process is applied differs.

As shown in the first and second embodiments, if the HSG forming step and impurity diffusing step are carried out in the same furnace, a certain problem occurs. In detail, if the HSG forming step and impurity diffusing step are frequently repeated, the formation of HSGs will be impaired.

This results from phosphorus (phosphine) accumulated on the inner wall of the furnace or the surface of a board to retain the wafer. In particular, phosphine is adsorbed at a low temperature portion away from the heater of the furnace, and is re-diffused in the furnace in the HSG forming step and impurity diffusing step, whereby the partial pressure of phosphine is increased in the furnace, which hinders formation of the crystal nucleus and HSG growth. Also, phosphine adsorbed at a low temperature portion reacts with water brought in by the wafer itself, thereby forming an absorptive phosphorous acid and accordingly increasing the partial pressure of water in the furnace.

As a result of examination, the inventors et al found that, if the partial pressure of the remaining phosphine in the furnace is kept at $1\times10^{-4}$ Torr or less, such a problem as described above can be prevented from occurring.

Therefore, the following processes are carried out between the removal of wafer, to which the above process is applied in a CVD furnace or LP-CVD furnace, therefrom and carry-in of water to which the above process is applied.

After the water in which impurities are diffused in the HSGs is removed from the furnace, the board from which the wafer is removed is carried into the furnace again. A gas including silane is introduced into the furnace. And the furnace is purged therewith for, for example, approx. 20 minutes. Thereby, a silicon layer is formed so as to cover phosphorus (phosphine) accumulated on the inner wall of the furnace and on the surface of the board.

Also, with the minimum furnace temperature kept at 60° C. or more, removal of phosphine adsorbed at the low temperature portion in the furnace is progressed.

Further, an inactive gas such as helium (He) or argon (Ar) is introduced into the furnace, and the pressure in the furnace is set to a slightly higher level (for example, 5 Torr). And, the pressure in the furnace is further increased and is maintained for an appointed period of time. Subsequently, the pressure in the furnace is lowered to, for example, 5 Torr. Thereby, by heating the low temperature portion in the furnace, degasing of phosphine adsorbed in the low temperature portion progresses.

As described above, it is possible to remove phosphorus (phosphine) accumulated on the inner wall of the furnace and on the surface of the board, and to keep the partial pressure of the remaining phosphine in the furnace at a low level (for example, $1\times10^{-5}$ Torr or less). Therefore, the HSG forming step and impurity diffusing step can be carried out in a stabilized state at all times.

In addition, although HSGs are made to grow with the pressure in the furnace set to $1\times10^{-7}$ Torr in the first embodiment and with the pressure in the furnace set to $1\times10^{-2}$ Torr, the HSGs may be made to grow by using an inactive gas (Helium, Argon, Nitrogen, etc.). If a small amount of an inactive gas circulates when HSGs grow, inverse diffusion of oxygen and water from a vacuum pump can be prevented from occurring, whereby cleaner HSGs can be formed.

Also, in the first embodiment, by lengthening the purging time (t4 and t5 in FIG. 5) of the remaining gas in the abovementioned LP-CVD furnace without any AMP process, it is possible to reduce the concentration of impurities on the extreme surface of the HSGs. In addition, the area at which the concentration of impurities is reduced is an area 1 through 5 nm deep from the surface of the HSGs, wherein the concentration is made lower than $3\times10^{20}$ atoms/cm$^3$. However, if the purging time is made too long, the impurities in the HSGs are diffused outside, thereby increasing the depletion of the lower electrode or causing migration of silicon atoms to re-occur. Therefore, since the shape of the HSGS may change, attention should be paid to deciding the purging time.

Figure 11:
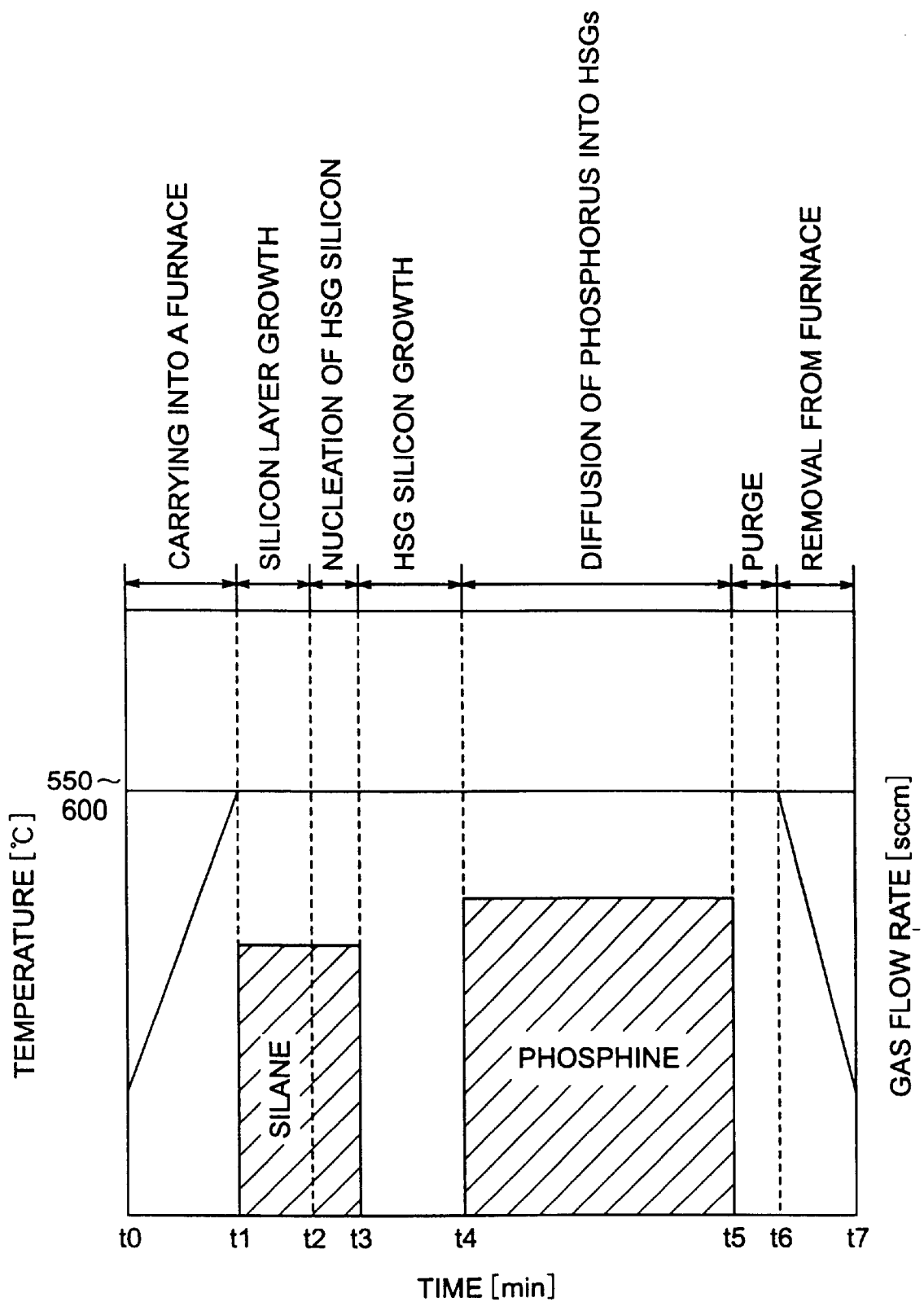
FIG. 11 is a timing chart showing another production process illustrated in FIG. 8.

Also, in the second embodiment, although the supply of silane is stopped when forming an amorphous silicon layer containing microcrystal on the silicon layer 61b (t2 and t3 in FIG. 10), silane may be supplied as shown in, for example, FIG. 11 (t2 and t3 in FIG. 11). In this case, by setting the pressure in the furnace to, for example, 0.02 Torr, it is possible to form an amorphous silicon layer containing microcrystal in a stabilized state. In addition, it is not necessary that the flow rate of silane in t1 and t2 is equal to that in t2 and t3.

Further, in the second embodiment, diffusion of impurities into the silicon layer 61b containing no impurities is carried out at the same time as diffusion of the impurities into the HSGs is carried out. But, where it is not possible to diffuse a sufficient amount of impurities, another silicon layer containing impurities may be provided below or between the silicon layers 61b. However, the concentration of impurities of the silicon layer is set to, for example, 1 through $3\times10^{20}$ atoms/cm$^3$.

Further, although, in the second embodiment, processes from the formation of the silicon layer 61b containing no impurities to the diffusion of impurities into the HSGs are carried out in the same furnace, a silicon layer 61b containing no impurities may be formed in advance by a separate furnace.

Figure 12:
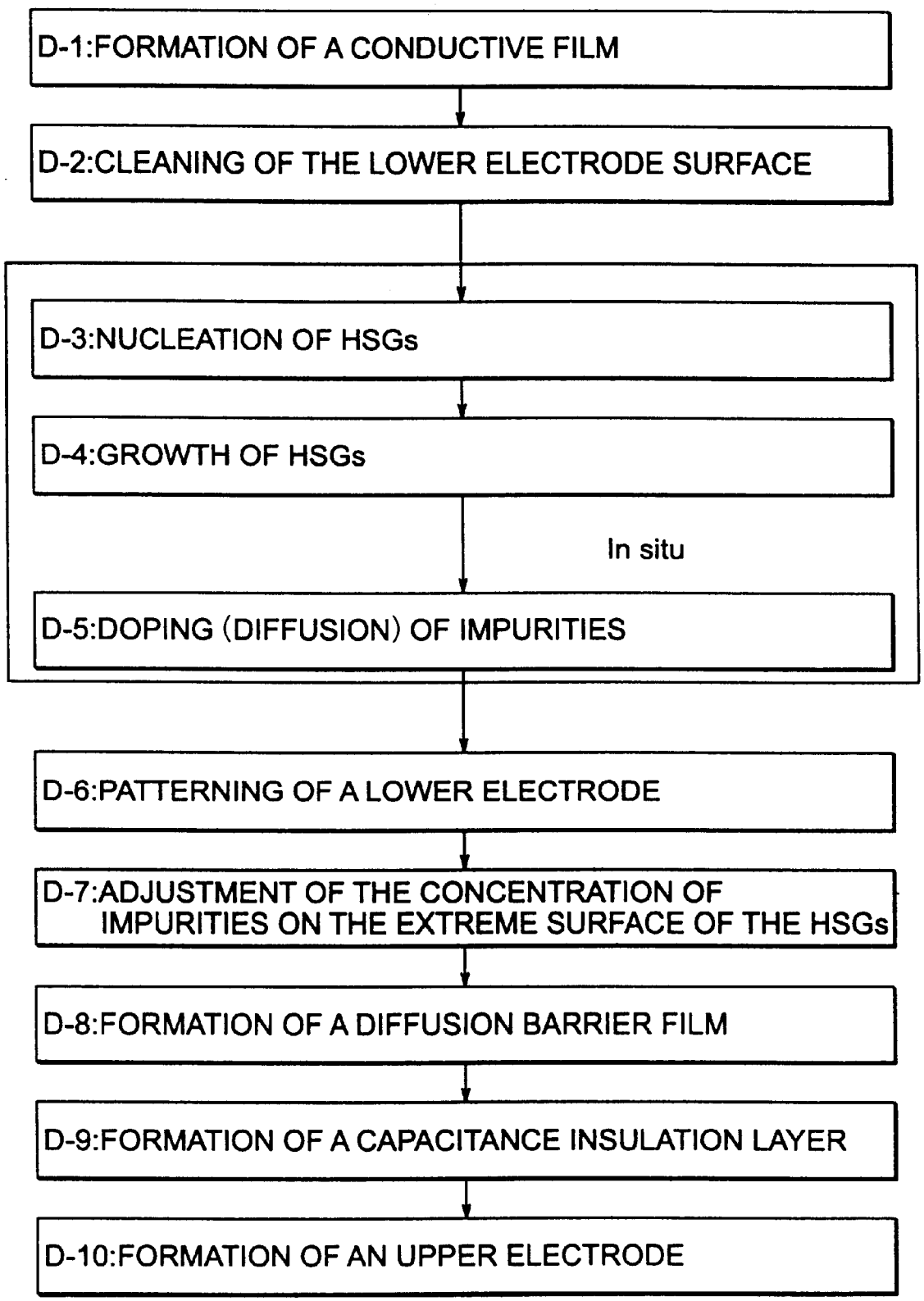
FIG. 12 is a flow chart showing another production process of a capacitor element according to the second embodiment.

FIG. 12 is a flow chart showing respective production processes in the case where the silicon layer 61b is formed by another furnace.

After the silicon layer 61b is formed (Step D-1 in FIG. 12), the surface of the silicon layer 61b is cleaned by a diluted flouric acid, etc. (Step D-2 in FIG. 12). And, as described-above, processes from the nucleation of HSGs to the diffusion of impurities into the HSGs are carried out in the same CVD furnace (Steps D-3 through D-5 in FIG. 12). And, after impurities are diffused into the HSGs, the wafer is removed from the furnace. Therefore, as in the second embodiment, the processes from patterning of the lower electrode 61 to formation of the upper electrode 63 are performed (Steps D-6 through D-10 in FIG. 12), thereby completing a capacitor element 60.

As described above, under the respective optimal conditions, the silicon layer 61b not containing impurities can be formed, the HSGS can be formed, and the impurities can be diffused.

Also, although, in the first and second embodiments, the photoresist 64 is used as a protection film when etching back, the patterning can be performed by an etching-back process using SOG (silanol) or a CMP (chemical mechanical polishing) method.

In addition, in the first and second embodiments, the capacitance insulation layer 62 and upper electrode 63 may be formed once the third interlayered insulation layer 50 is removed.

Figure 13A:
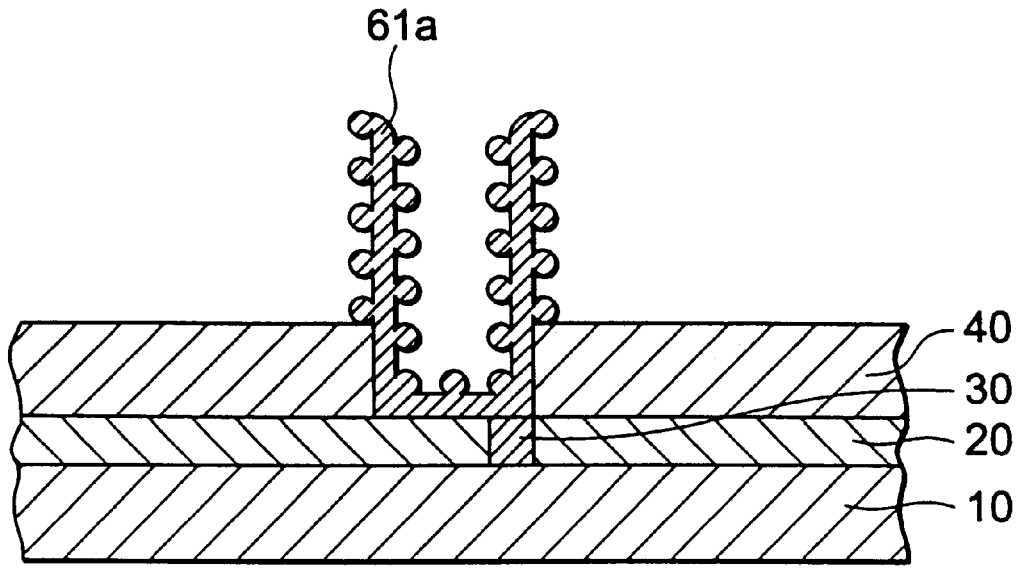
FIG. 13 is a sectional view showing another production process of a capacitor element according to the first embodiment.
Figure 13B:
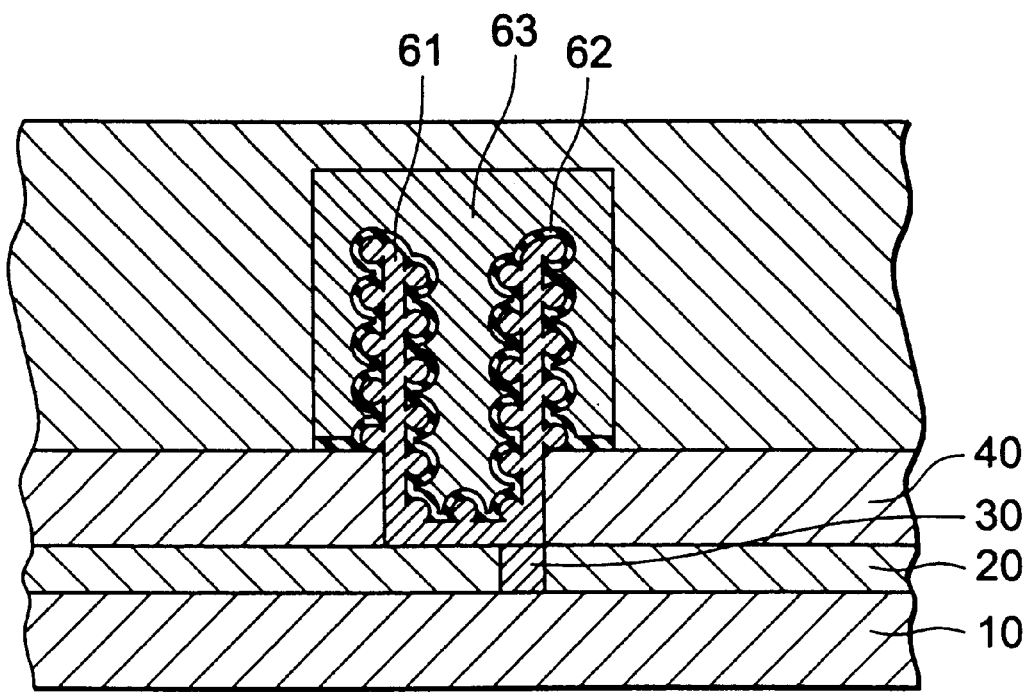

In the first embodiment, after the silicon layer 61a is patterned, the third interlayered insulation layer 50 is removed. And, HSGs are formed as described above. Thereby, as shown in FIG. 13(a), HSGs are formed on both the inside and outside of the cylindrically formed silicon film 61b (lower electrode 61). Thereafter, as shown in FIG. 13(b), a capacitance insulation layer 62 and an upper electrode 63 are formed on the lower electrode 61.

As described above, the surface area of the lower electrode 61 can be remarkably increased. That is, the capacitance of the capacitor element 60 can be remarkably increased, compared to the above. In detail, the capacitance can become two times that of the capacitor element referred to in the first embodiment. However, in the case where the interval between the lower electrode and its adjacent electrode is more narrow than approx. 0.1 μm, there is a possibility that the electrodes are short-circuited due to growth of the HSGS. In such a case, after the HSGs are formed, the interlayered insulation layer may be removed.

Figure 14A:
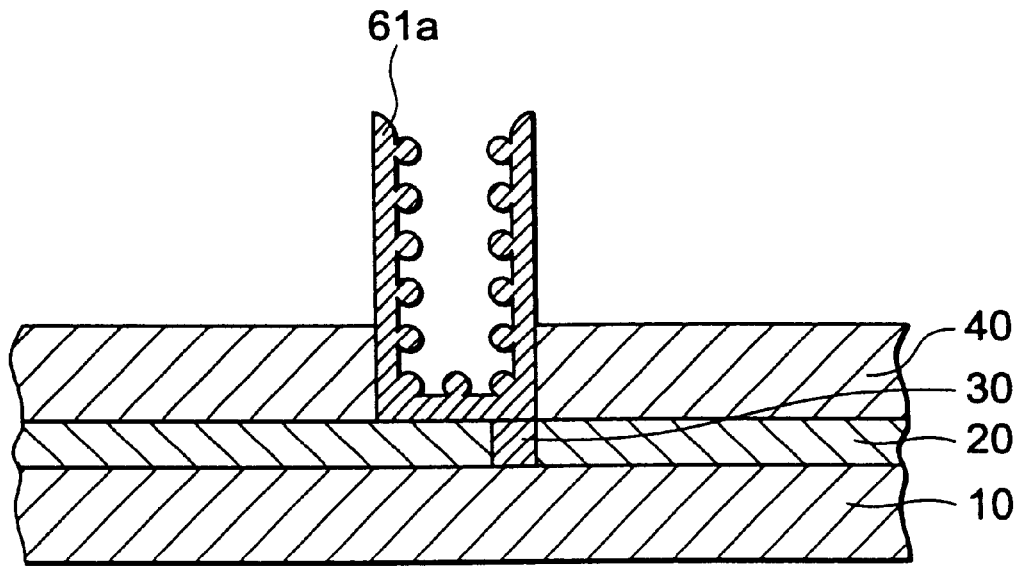
FIG. 14 is a sectional view showing still another production process of a capacitor element according to the first and second embodiments.
Figure 14B:
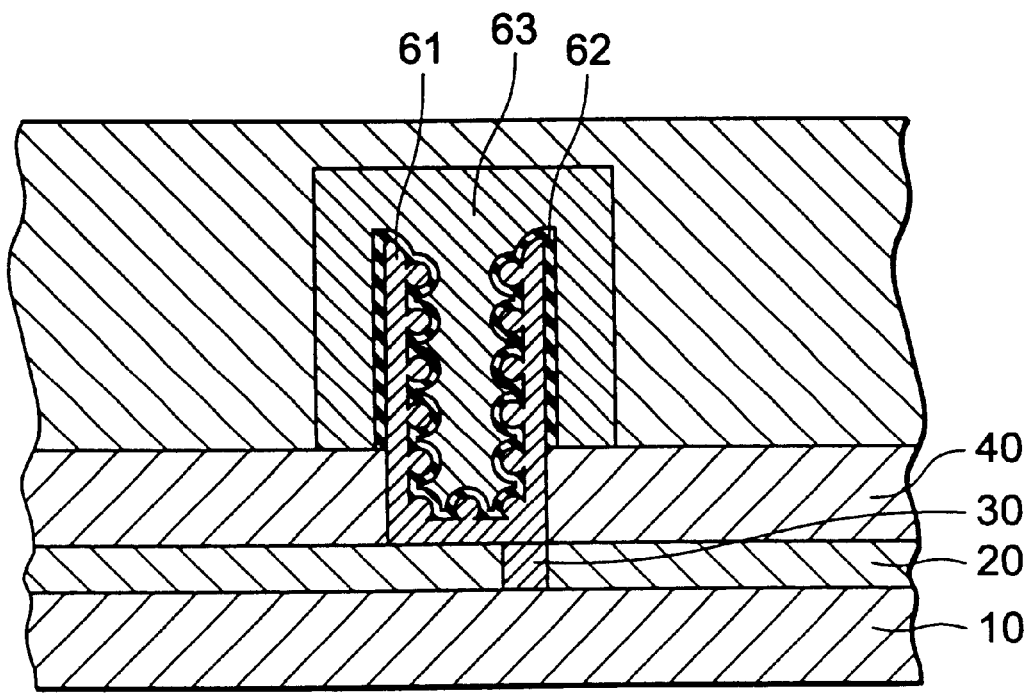

If the interlayered insulation layer 50 is removed after the HSGs are formed, HSGs are formed only inside the cylindrically formed silicon layer 61a (lower electrode 61) as shown in FIG. 14(a). Thereafter, as shown in FIG. 14(b), the capacitance insulation layer 62 and upper electrode 63 are formed on the lower electrode 61. Thereby, the capacitance of the capacitor element 60 can be further increased, compared to the above. In detail, the capacitance is increased by approx. 1.6 times that of the capacitor element illustrated in the first embodiment.

In addition, in the second embodiment, after the silicon layer 61b is patterned, the third interlayered insulation layer 50 is removed as shown in FIG. 14(a). And, as shown in FIG. 14(b), the capacitance insulation layer 62 and upper electrode 63 are formed on the lower electrode 61. If so, the capacitance insulation layer 62 and upper electrode 63 are formed over a wider area than the area shown in the second embodiment. Therefore, the capacitance of the capacitor element 60 can be further increased, compared with the above case. In detail, the capacitance can be further increased by approx. 1.6 times that of the capacitor element shown in the second embodiment.

Further, in the third embodiment, raising, maintaining and lowering the abovementioned pressure in the furnace may be repeated when removing phosphine. These processes may be carried out as well in the first and second preferred embodiments.

Also, the diffusion barrier film on the surface of the lower electrode 61, capacitance insulation layer 62, and upper electrode 63 may be formed of materials other than the above. For example, the diffusion barrier film on the surface of the lower electrode 61 may be formed of titanium nitride (TiN), etc., the capacitance insulation layer 62 may be formed of a highly dielectric body film such as Ta2O5, etc., and the upper electrode 63 may be formed of a metallic substance such as titanium nitride (TiN), tungsten nitride (WN), etc.

What is claimed is:

1. A method for producing capacitor elements constructed of a lower electrode, a dielectric body layer and an upper electrode, which are formed on a semiconductor substrate, comprising:

a first silicon layer forming step for forming a first amorphous silicon layer at an appointed area on the semiconductor substrate, a lower electrode surface rinsing step for rinsing the surface of said first silicon layer, a nucleus forming step for selectively forming a second amorphous silicon layer including microcrystal on the surface of said first silicon layer, an HSG forming step for growing HSGs (hemispherical Grains) using microcrystal included in said second silicon layer as a nucleus by annealing said first and second silicon layer at a low pressure or in the atmosphere of an inactive gas, and forming HSGs on the surface of said first silicon layer, an impurity diffusing step for forming a lower electrode by annealing while said HSGs are being exposed to a source gas including impurities and thermally diffusing said impurities in said HSGS, a dielectric body layer forming step for forming a dielectric body layer on said first silicon layer having said HSGs on the surface thereof, and an upper electrode forming step for forming an upper electrode on said dielectric body layer, wherein the partial pressure of oxygen and water is maintained at $1 \times 10^{-6}$ Torr or less at least between said HSG forming step and said impurity diffusing step.

2. A method for producing a capacitor element as set forth in claim 1, wherein said nucleus forming step, said HSG forming step, and said impurity diffusing step are carried out in the same reaction chamber of a low pressure chemical vapor deposition apparatus (LPCVD apparatus).

3. A method for producing a capacitor element as set forth in claim 2, wherein said nucleus forming step and said HSG forming step is to make the partial pressure of the remaining PH3 gas in the reaction chamber lower than $1 \times 10^{-4}$ Torr.

4. A method for producing a capacitor element as set forth in claim 2, wherein after said semiconductor substrate is removed from said reaction chamber after said impurity diffusion step, a gas including silane or disilane is introduced into said reaction chamber to reduce the normal PH3 gas in said reaction chamber.

5. A method for producing a capacitor element as set forth in claim 2, wherein, while the minimum temperature on the inner wall of said reaction chamber is maintained at 60° C. or more, a step for progressive removing remaining PH3 gas adsorbed on a low temperature portion of the corresponding reaction chamber to reduce the amount of the remaining PH3 gas in the corresponding reaction chamber is further provided.

6. A method for producing a capacitor element as set forth in claim 2, wherein a step is provided, where a series of actions are repeated an appointed number of times, in which after said impurity diffusing step, an inactive gas is introduced into said reaction chamber after said semiconductor substrate is removed from said reaction chamber, the pressure of said reaction chamber is increased and is kept for an appointed period of time,.and subsequently the pressure is reduced, the low temperature portion in said reaction chamber is heated to progressively remove PH3 gas adsorbed on the low temperature portion in said reaction chamber, and the remaining PH3 gas in said reaction chamber is reduced.

7. A method for producing a capacitor element as set forth in claim 1, wherein said impurity diffusing step is carried out at a temperature from 550 through 600° C.

8. A method for producing a capacitor element as set forth in claim 1, wherein the annealing temperature in the HSG forming step is substantially equal to that in the impurity diffusing step.

9. A method for producing a capacitor element as set forth in claim 1, wherein an etching step for etching the surface area of the HSGs is further provided before said dielectric body layer forming step.

10. A method for producing a capacitor element as set forth in claim 9, wherein said etching is performed to a depth from 1 nm through 5 nm from the surface of said HSGs.

11. A method for producing a capacitor element as set forth in claim 1, wherein a step for lowering the concentration of impurities on the surface of said HSGs by annealing with reduced pressure is further provided after the impurity diffusing step.

12. A method for producing a capacitor element as set forth in claim 11, wherein the concentration of impurities on the surface of said HSGs before the dielectric body layer forming step is set to a value lower than $3 \times 10^{20}$ atoms/cm$^3$.

13. A method for producing a capacitor element as set forth in claim 1, wherein the impurities contained in said source gas is $PH_3$.

14. A method for producing a capacitor element as set forth in claim 1, wherein said first silicon forming step is further provided, before the nucleus forming step, with a step for forming the first silicon layer on the inner wall of a recess held by an insulation layer formed on said semiconductor substrate and for removing at least a part of said insulation layer so that the first silicon layer formed on the inner wall of the recess protrudes from the corresponding recess.

15. A method for producing capacitor elements constructed of a lower electrode, a dielectric body layer, and an upper electrode, which are formed on a semiconductor substrate, comprising a first silicon layer forming step for forming a first amorphous silicon layer on the entire surface including the inner wall of a recess on an insulation layer having said recess at an appointed part, a lower electrode rinsing step for rinsing and cleaning the surface of said first silicon layer, a nucleus forming step for forming a second amorphous silicon layer including microcrystal on the surface of said first silicon layer, an HSG forming step for growing HSGs (hemispherical Grains) using microcrystal included in said second silicon layer as a nucleus by annealing said first and second silicon layer at a low pressure or in the atmosphere of an inactive gas, and forming HSGs on the surface of said first silicon layer, an impurity diffusing step for forming a lower electrode by annealing while said HSGs are being exposed to a source gas including impurities and thermally diffusing said impurities in said HSGs, a lower electrode forming step for forming a lower electrode in said recess by etching back said first silicon layer having said HSGS on the surface thereof, a dielectric body layer forming step for forming a dielectric body layer on the surface of said lower electrode, and an upper electrode forming step for forming an upper electrode on the surface of said dielectric body layer, wherein the partial pressure of oxygen and water is maintained at $1 \times 10^{-6}$ Torr or less at least between said HSG forming step and said impurity diffusing step.

16. A method for producing a capacitor element as set forth in claim 15, wherein said nucleus forming step, said HSG forming step, and said impurity diffusing step are carried out in the same reaction chamber of a low pressure chemical vapor deposition apparatus (LPCVD apparatus).

17. A method for producing a capacitor element as set forth in claim 16, wherein said nucleus forming step and said HSG forming step is to make the partial pressure of the remaining PH3 gas in the reaction chamber lower than $1 \times 10^{-4}$ Torr.

18. A method for producing a capacitor element as set forth in claim 16, wherein after said semiconductor substrate is removed from said reaction chamber after said impurity diffusion step, a gas including silane or disilane is introduced into said reaction chamber to reduce the normal PH3 gas in said reaction chamber.

19. A method for producing a capacitor element as set forth in claim 16, wherein, while the minimum temperature on the inner wall of said reaction chamber is maintained at 60° C. or more, a step for progressive removing remaining PH3 gas adsorbed on a low temperature portion of the corresponding reaction chamber to reduce the amount of the remaining $PH_3$ gas in the corresponding reaction chamber is further provided.

20. A method for producing a capacitor element as set forth in claim 16, wherein a step is provided, where a series of actions are repeated an appointed number of times, in which after said impurity diffusing step, an inactive gas is introduced into said reaction chamber after said semiconductor substrate is removed from said reaction chamber, the pressure of said reaction chamber is increased and is kept for an appointed period of time, and subsequently the pressure is reduced, the low temperature portion in said reaction chamber is heated to progressively remove $PH_3$ gas adsorbed on the low temperature portion in said reaction chamber, and the remaining PH3 gas in said reaction chamber is reduced.

21. A method for producing a capacitor element as set forth in claim 15, wherein said impurity diffusing step is carried out at a temperature from 550 through 600° C.

22. A method for producing a capacitor element as set forth in claim 15, wherein the annealing temperature in the HSG forming step is substantially equal to that in the impurity diffusing step.

23. A method for producing a capacitor element as set forth in claim 15, wherein an etching step for etching the surface area of the HSGs is further provided before said dielectric body layer forming step.

24. A method for producing a capacitor element as set forth in claim 23, wherein said etching is performed to a depth from 1 nm through 5 nm from the surface of said HSGs.

25. A method for producing a capacitor element as set forth in claim 15, wherein a step for lowering the concentration of impurities on the surface of said HSGs by annealing with reduced pressure is further provided after the impurity diffusing step.

26. A method for producing a capacitor element as set forth in claim 25, wherein the concentration of impurities on the surface of said HSGs before the dielectric body layer forming step is set to a value lower than $3 \times 10^{20}$ atoms /cm$^3$.

27. A method for producing a capacitor element as set forth in claim 15, wherein a step for removing at least a part of the insulation layer so that the lower electrode in said recess protrudes from said insulation layer is further provided before said dielectric body layer forming step.

28. A method for producing a capacitor element as set forth in claim 15, wherein a step for forming a protective material, which protects the inside of said recess when etching back in the corresponding lower electrode forming step, on said first silicon layer having said HSGs is provided before said lower electrode forming step.

29. A method for producing capacitor elements constructed of a lower electrode, a dielectric body layer, and an upper electrode, which are formed on a semiconductor substrate, comprising:

a first silicon layer forming step for forming a first amorphous silicon layer on the entire surface including the inner wall of a recess on an insulation layer having said recess at an appointed part, a nucleus forming step for forming a second amorphous silicon layer including microcrystal on the surface of said first silicon layer, an HSG forming step for growing HSGs (hemispherical Grains) using microcrystal included in said second silicon layer as a nucleus by annealing said first and second silicon layer at a low pressure or in the atmosphere of an inactive gas, and forming HSGs on the surface of said first silicon layer, an impurity diffusing step for forming a lower electrode by annealing while said HSGs are being exposed to a source gas including impurities and thermally diffusing said impurities in said HSGs, a lower electrode forming step for forming a lower electrode in said recess by etching back said first silicon layer having said HSGs on the surface thereof, a dielectric body layer forming step for forming a dielectric body layer on the surface of said lower electrode, and an upper electrode forming step for forming an upper electrode on the surface of said dielectric body layer, wherein the partial pressure of oxygen and water is maintained at $1 \times 10^{-6}$ Torr or less at least between said HSG forming step and said impurity diffusing step.

30. A method for producing a capacitor element as set forth in claim 29, wherein said first silicon layer forming step, said nucleus forming step, said HSG forming step, and said impurity diffusing step are carried out in the same reaction chamber of a low pressure chemical vapor deposition apparatus (LPCVD apparatus).

31. A method for producing a capacitor element as set forth in claim 30, wherein said nucleus forming step and said HSG forming step is to make the partial pressure of the remaining PH3 gas in the reaction chamber lower than $1 \times 10^{-4}$ Torr.

32. A method for producing a capacitor element as set forth in claim 30, wherein after said semiconductor substrate is removed from said reaction chamber after said impurity diffusion step, a gas including silane or disilane is introduced into said reaction chamber to reduce the normal PH3 gas in said reaction chamber.

33. A method for producing a capacitor element as set forth in claim 30, wherein, while the minimum temperature on the inner wall of said reaction chamber is maintained at 60° C. or more, a step for progressive removing remaining PH3 gas adsorbed on a low temperature portion of the corresponding reaction chamber to reduce the amount of the remaining $PH_3$ gas in the corresponding reaction chamber is further provided.

34. A method for producing a capacitor element as set forth in claim 30, wherein a step is provided, where a series of actions are repeated an appointed number of times, in which after said impurity diffusing step, an inactive gas is introduced into said reaction chamber after said semiconductor substrate is removed from said reaction chamber, the pressure of said reaction chamber is increased and is kept for an appointed period of time, and subsequently the pressure is reduced, the low temperature portion in said reaction chamber is heated to progressively remove $PH_3$ gas adsorbed on the low temperature portion in said reaction chamber, and the remaining PH3 gas in said reaction chamber is reduced.

35. A method for producing a capacitor element as set forth in claim 29, wherein said impurity diffusing step is carried out at a temperature from 550 through 600° C.

36. A method for producing a capacitor element as set forth in claim 29, wherein the annealing temperature in the HSG forming step is substantially equal to that in the impurity diffusing step.

37. A method for producing a capacitor element as set forth in claim 29, wherein an etching step for etching the surface area of the HSGs is further provided before said dielectric body layer forming step.

38. A method for producing a capacitor element as set forth in claim 37, wherein said etching is performed to a depth from 1 nm through 5 nm from the surface of said HSGs.

39. A method for producing a capacitor element as set forth in claim 29, wherein a step for lowering the concentration of impurities on the surface of said HSGs by annealing with reduced pressure is further provided after the impurity diffusing step.

40. A method for producing a capacitor element as set forth in claim 39, wherein the concentration of impurities on the surface of said HSGs before the dielectric body layer forming step is set to a value lower than $3 \times 10^{20}$ atoms/cm$^3$.

41. A method for producing a capacitor element as set forth in claim 29, wherein a step for removing at least a part of the insulation layer so that the lower electrode in said recess protrudes from said insulation layer is further provided before said dielectric body layer forming step.

42. A method for producing a capacitor element as set forth in claim 29, wherein a step for forming a protective material, which protects the inside of said recess when etching back in the corresponding lower electrode forming step, on said first silicon layer having said HSGs is provided before said lower electrode forming step.

* * * * *